United States Patent
Oliaei et al.

(10) Patent No.: US 10,281,485 B2
(45) Date of Patent: May 7, 2019

(54) MULTI-PATH SIGNAL PROCESSING FOR MICROELECTROMECHANICAL SYSTEMS (MEMS) SENSORS

(71) Applicant: INVENSENSE, INC., San Jose, CA (US)

(72) Inventors: Omid Oliaei, San Jose, CA (US); Mehran Ayat, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 130 days.

(21) Appl. No.: 15/224,131

(22) Filed: Jul. 29, 2016

(65) Prior Publication Data

US 2018/0031597 A1    Feb. 1, 2018

(51) Int. Cl.
   *G01P 13/00*     (2006.01)
   *B81B 7/00*      (2006.01)
   (Continued)

(52) U.S. Cl.
   CPC .............. *G01P 13/00* (2013.01); *B81B 7/008* (2013.01); *G01C 19/00* (2013.01);
   (Continued)

(58) Field of Classification Search
   CPC .... B81B 2201/0235; B81B 2201/0242; B81B 2207/012; B81B 7/008; G01C 19/00;
   (Continued)

(56) References Cited

U.S. PATENT DOCUMENTS 7,492,217 B2   2/2009   Hansen et al.
8,934,649 B1   1/2015   Lee et al.
(Continued)

FOREIGN PATENT DOCUMENTS

CN   101141828 A   3/2008
CN   201312384 Y   9/2009
(Continued)

OTHER PUBLICATIONS

International Search Report dated Oct. 20, 2017 for PCT Application No. PCT/US2017/044546, 14 pages.
(Continued)

*Primary Examiner* — Francis C Gray
(74) *Attorney, Agent, or Firm* — Amin, Turocy & Watson, LLP

(57) ABSTRACT

Multi-path signal processing for microelectromechanical systems (MEMS) sensors is described. An exemplary MEMS sensor apparatus can comprise a single MEMS sensor element and an associated integrated circuit (IC) that facilitates generating multiple output signals having different output signal electrical characteristics required by a host system. Provided implementations can minimize cost and IC die area of associated MEMS sensor apparatuses and systems by employing one or more signal multiplexers (MUXs) on a single common signal path from the single MEMS sensor element. In addition, various methods of generating multiple output signals having different output signal electrical characteristics from a single MEMS sensor element are described.

26 Claims, 10 Drawing Sheets

(51) Int. Cl.
*G01C 19/00* (2013.01)
*G01P 15/08* (2006.01)
*G01C 19/5776* (2012.01)
*H04R 1/04* (2006.01)

(52) U.S. Cl.
CPC .......... *G01C 19/5776* (2013.01); *G01P 15/08* (2013.01); *H04R 1/04* (2013.01); *B81B 2201/0235* (2013.01); *B81B 2201/0242* (2013.01); *B81B 2207/012* (2013.01)

(58) Field of Classification Search
CPC ..... G01C 19/5776; G01P 13/00; G01P 15/08; H04R 1/04
See application file for complete search history.

(56) References Cited

U.S. PATENT DOCUMENTS

| | | |
|---|---|---|
| 2005/0114583 A1 | 5/2005 | Beale |
| 2006/0034472 A1 | 2/2006 | Bazarjani et al. |
| 2006/0237806 A1 | 10/2006 | Martin et al. |
| 2007/0127761 A1* | 6/2007 | Poulsen ............... H03M 7/3015 381/355 |
| 2008/0123891 A1 | 5/2008 | Kato et al. |
| 2008/0274395 A1 | 11/2008 | Shuster |
| 2009/0091370 A1* | 4/2009 | Kawasaki ................ H03J 3/20 327/365 |
| 2010/0183174 A1 | 7/2010 | Suvanto et al. |
| 2011/0066041 A1 | 3/2011 | Pandia et al. |
| 2011/0075861 A1 | 3/2011 | Wu |
| 2011/0142261 A1 | 6/2011 | Josefsson |
| 2011/0208520 A1 | 8/2011 | Lee |
| 2011/0268280 A1 | 11/2011 | Kawashima |
| 2011/0278684 A1 | 11/2011 | Kasai |
| 2012/0300961 A1 | 11/2012 | Moeller |
| 2013/0208923 A1 | 8/2013 | Suvanto |
| 2013/0308506 A1 | 11/2013 | Kim et al. |
| 2014/0072151 A1 | 3/2014 | Ochs et al. |
| 2014/0334643 A1 | 11/2014 | Pinna et al. |
| 2014/0343949 A1 | 11/2014 | Huang et al. |
| 2014/0348345 A1 | 11/2014 | Furst et al. |
| 2015/0027198 A1* | 1/2015 | Sessego ............... G01P 15/125 73/1.37 |
| 2015/0256914 A1* | 9/2015 | Wiesbauer ............... H04R 3/00 381/174 |
| 2015/0281836 A1* | 10/2015 | Nguyen ................... H04R 3/00 381/120 |
| 2015/0350772 A1* | 12/2015 | Oliaei ..................... H04R 1/04 381/111 |

FOREIGN PATENT DOCUMENTS

| | | |
|---|---|---|
| CN | 102158787 A | 8/2011 |
| CN | 103200508 A | 7/2013 |
| WO | 2005/055566 A1 | 6/2005 |

OTHER PUBLICATIONS

Office Action dated Sep. 10, 2018 for U.S. Appl. No. 14/628,686, 41 pages.
International Search Report and Written Opinion dated Aug. 25, 2015 for PCT Application Serial No. PCT/US2015/033600, 12 pages.
Office Action dated Nov. 20, 2015 for U.S. Appl. No. 14/293,502, 27 pages.
Office Action dated May 20, 2016 for U.S. Appl. No. 14/293,502, 22 pages.
Office Action dated Nov. 9, 2016 for U.S. Appl. No. 14/628,686, 49 pages.
Office Action dated Sep. 23, 2016 for U.S. Appl. No. 14/293,502, 22 pages.
Office Action dated Apr. 3, 2017 for U.S. Appl. No. 14/293,502, 31 pages.
Office Action dated Jun. 9, 2017 for U.S. Appl. No. 14/628,686, 34 pages.
Office Action dated Sep. 8, 2017 for U.S. Appl. No. 14/293,502, 17 pages.
Office Action dated Sep. 27, 2017 for U.S. Appl. No. 14/628,686, 30 pages.
European Search Report dated Nov. 27, 2017 for European Application No. 15803063.5, 10 pages.
Raychowdhury et al. "A 2.3nJ/Frame Voice Activity Detector Based Audio Front-end for Context-Aware System-On-Chip Applications in 32mn CMOS," IEEE Conference on Custom Integrated Circuits, Sep. 9, 2012, pp. 1-4.
European Office Action dated Dec. 14, 2017 for European Application No. 15803063.5, 1 page.
Chinese Office Action dated May 17, 2018 for Chinese Patent Application No. 201610099750.8, 26 pages (including English translation).
Final Office Action received for U.S. Appl. No. 14/628,686 dated May 11, 2018, 45 pages.
Chinese Office Action and Search Report dated Oct. 23, 2018 for Chinese Patent Application No. 201580036028.3, 18 pages (including English translation).
Raychowdhury et al., "A 2.3 nJ/Frame Voice Activity Detector-Based Audio Front-End for Context-Aware System-On-Chip Applications in 32-nm CMOS," IEEE Journal of Solid-State Circuits, May 2013, vol. 48, No. 8, 8 pages.

* cited by examiner

MULTI-PATH SIGNAL PROCESSING FOR MICROELECTROMECHANICAL SYSTEMS (MEMS) SENSORS

TECHNICAL FIELD

The subject disclosure relates to microelectromechanical systems (MEMS) sensors and more particularly to multi-path signal processing for microelectromechanical systems (MEMS) Sensors.

BACKGROUND

Mobile devices are becoming increasingly lightweight and compact. Contemporaneously, user demand for applications that are more complex, provide persistent connectivity, and/or are more feature-rich is in conflict with the desire to provide inexpensive, lightweight, and compact devices that also provide a tolerable level of battery life before requiring recharging. Thus, demands to increase functionality while reducing power consumption of such devices has created the need for increasingly more compact and feature rich sensor systems.

For example, conventional host systems such as mobile devices may use multiple motion sensors (e.g., microelectromechanical systems (MEMS) sensor element such as an accelerometer, a gyroscope, etc.) of a sensor system, which are specifically designed and/or configured for different, specific applications. For instance, one specific application might require a specific output data rate (ODR) and/or filtering requirement, while another application on the mobile device might require a different ODR and/or filtering requirement. It can be understood that other output data requirements can vary between different, specific applications, as further described herein.

As a further example, one motion sensor of a mobile device may be used by a user interface (UI) to determine, for example, the orientation of the device, while another motion sensor of the mobile device may be used for optical image stabilization (OIS). While taking a picture, the sensor system simultaneously supports both applications by providing the type and character of output data that is suitable for each application (e.g., UI and OIS) by dedicating respective motion sensor output data streams. For instance, the UI output may require a lower data rate and/or more aggressive filtering, while the OIS output may need a shorter latency and a different full-scale range. These conflicting requirements are conventionally addressed using separate signal paths that increases the cost of the sensor system.

Accordingly, conventional host systems employing sensor systems that have two or more different sensor output data requirements (e.g., OIS data requirements, UI data requirements, etc.) may employ two or more unique sensor systems (e.g., a sensor element, an amplifier, an analog-to-digital converter (ADC), digital filters, etc. to support OIS requirements, and another sensor element, an amplifier, ADC, digital filter, etc. to support UI requirements, etc.). It can be understood that employing unique sensor systems for each output data requirement is both costly and space intensive in terms of application specific integrated circuit (ASIC) die area. Other host systems employing sensor systems that have two or more different sensor output data requirements may employ one MEMS sensor element (e.g., an accelerometer, a gyroscope, etc.), but may replicate a signal processing chain (e.g., separate amplifier, separate ADC, separate digital filters, etc.) to meet each output data requirement. It can be understood that employing unique sensor systems and replicating the signal processing chain for each output data requirement is costly and/or space intensive in terms of integrated circuit (IC) or ASIC die area.

It is thus desired to provide sensors systems that improve upon these and other deficiencies. The above-described deficiencies are merely intended to provide an overview of some of the problems of conventional implementations, and are not intended to be exhaustive. Other problems with conventional implementations and techniques, and corresponding benefits of the various aspects described herein, may become further apparent upon review of the following description.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In a non-limiting example, exemplary apparatuses are described which can comprise a microelectromechanical systems (MEMS) sensor package comprising a MEMS sensor, an integrated circuit (IC) disposed in the MEMS sensor package, which can be configured to receive an electrical signal from the MEMS sensor, comprising an electrical circuit comprising a single common signal path from the MEMS sensor, and which can be configured to simultaneously provide at least a first output signal according to a first signal requirement and a second output signal according to a second signal requirement. In non-limiting aspects, exemplary apparatuses can further comprise two or more signal outputs of the sensor package corresponding to the first output signal and the second output signal, and one or more signal multiplexers of the IC, which can be configured to provide an output signal corresponding to one of the first output signal or the second output signal based on a selection from among electrical signals available along the single common signal path in the IC.

Moreover, exemplary methods are described, which comprises receiving an electrical signal from a MEMS sensor in a sensor package and processing the electrical signal in an electrical circuit of the sensor package comprising a single common signal path, wherein the electrical circuit is configured to simultaneously provide a first output signal according to a first signal requirement and a second output signal according to a second signal requirement via the single common signal path. Exemplary methods can further comprise selecting from among electrical signals available along the common signal path to provide an output signal corresponding to one of the first output signal or the second output signal based on a selection of electrical signals available along the single common signal path, providing the first output signal having a first set of electrical characteristics, and simultaneously providing the second output signal having a second set of electrical characteristics, wherein a subset of the first set of electrical characteristics differs from a subset of the second set of electrical characteristics according to a difference between the first signal requirement and the second signal requirement, as further described herein.

These and other embodiments are described in more detail below.

BRIEF DESCRIPTION OF THE DRAWINGS

Various non-limiting embodiments are further described with reference to the accompanying drawings, in which.

DETAILED DESCRIPTION

Overview

Figure 1:
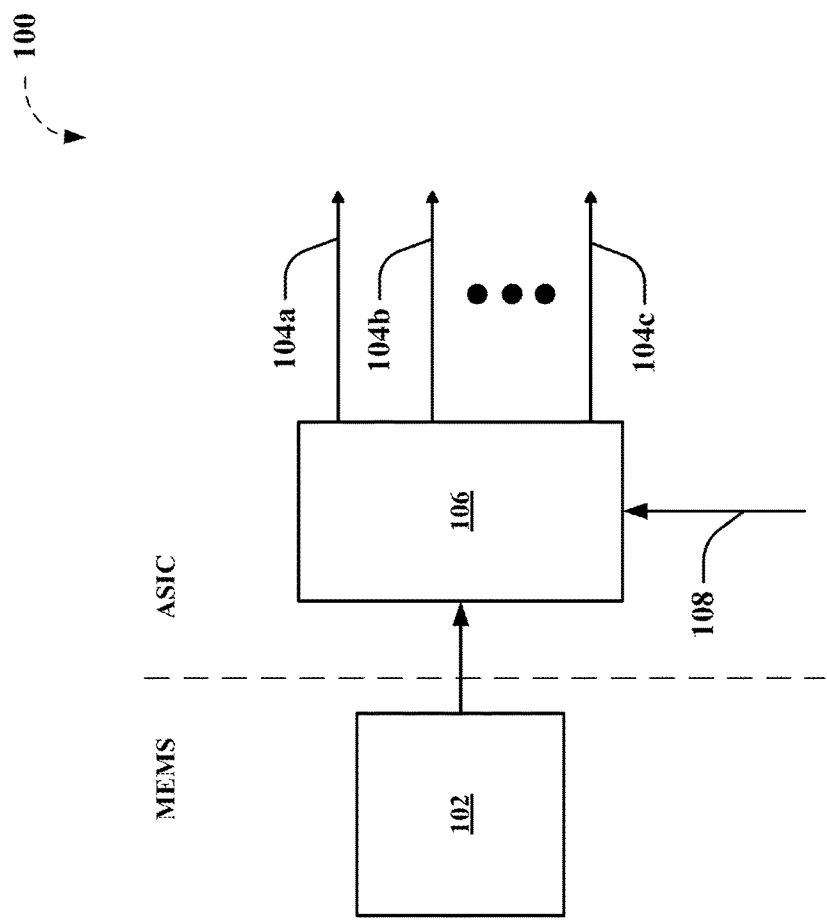
FIG. 1 depicts a functional block diagram of an exemplary microelectromechanical systems (MEMS) sensor system or apparatus, in which a MEMS sensor element facilitates generating multiple output signals with an associated integrated circuit (IC), according to various non-limiting embodiments.

While a brief overview is provided, certain aspects of the subject disclosure are described or depicted herein for the purposes of illustration and not limitation. Thus, variations of the disclosed embodiments as suggested by the disclosed apparatuses, systems, and methodologies are intended to be encompassed within the scope of the subject matter disclosed herein. As a non-limiting example, while various embodiments are described herein in reference to a motion sensor comprising a micro-electromechanical systems (MEMS) sensor element (e.g., an accelerometer, a gyroscope, etc.) for the purposes of illustration, and not limitation, it can be understood that various embodiments as described herein can be employed in any kind of motion sensor system (e.g., a MEMS motion sensor element such as an accelerometer, a gyroscope, etc.) or any other sensor system (e.g., a microphone sensor system, etc) that supports host systems or applications having two or more different sensor output data requirements (e.g., optical image stabilization (OIS) data requirements, user interface (UI) data requirements, etc.) from a single sensor element. In addition, described embodiments can be employed on each signal of an X-axis, a Y-axis, and/or a Z-axis of a multi-axis MEMS motion sensor element (e.g., an accelerometer, a gyroscope, etc.).

As described above, conventional host systems (e.g., mobile devices, application processors, microcontrollers, etc.) employing sensor systems that have two or more different sensor output data requirements (e.g., OIS data requirements, UI data requirements, etc.) may employ two or more unique sensor systems (e.g., a sensor element, an amplifier, analog-to-digital converter (ADC), etc. to support OIS requirements, a sensor element, an amplifier, ADC, etc. to support UI requirements, etc.). For instance, typical host systems comprising a motion sensor comprise a MEMS motion sensor element (e.g., an accelerometer, a gyroscope, etc.), an analog amplifier, an ADC, a signal correction component (e.g., correction for gain, and/or offset, etc.), and multiple stages of digital filters. However, the data output that is provided to a host system (e.g., mobile device, application processor, microcontroller, etc.) is provided by the output of the last digital filter in the multiple stages of digital filters. Such sensor systems provide only one sensor (e.g., an accelerometer, a gyroscope, microphone, etc.) data output for one host system or application.

As further described above, in some sensor applications, it may be required to support more than one host system or application, for example, where each host system or application can require a data stream having at least one unique output data requirement (e.g., between two or more data streams), such as output data rate (ODR), latency, full-scale range (e.g., maximum signal that can be processed), a special filtering requirement, frequency response, and/or a signal standardization convention associated with the output data (e.g., Inter-Integrated Circuit ($I^2C$) interface requirements, Serial Peripheral Interface (SPI) requirements, etc.), and/or other output data requirement.

As a non-limiting example, one application processor of a host system can require one data output to track a user's input for a UI, while another application processor of a host system can require a second data output for OIS. In another example, yet another application processor of a host system can require a third data output for determination of the orientation of a host system device. For example, OIS may require a larger full-scale range and a higher data rate, whereas a UI may require a lower data rate or more aggressive filtering.

As further described above, employing unique sensor systems for each output data requirement is both costly and space intensive in terms of integrated circuit (IC) or application specific integrated circuit (ASIC) die area. Other host systems employing sensor systems that have two or more different sensor output data requirements may employ one MEMS sensor element (e.g., an accelerometer, a gyroscope, etc.), but may replicate a signal processing chain (e.g., separate amplifier, separate ADC, separate digital filters, etc.) to meet each output data requirement. It can be understood that employing unique sensor systems or replicating the signal processing chain for each output data requirement is costly and/or space intensive in terms of IC or ASIC die area.

In a non-limiting aspect of the disclosed subject matter, one or more multiplexers (MUX) can be provided to select between outputs available at intermediate stages of multiple stages digital filters in a single common signal path while simultaneously providing two or more output signals to multiple hosts systems or applications, using a single MEMS sensor (e.g., a single MEMS motion sensor element, a single MEMS microphone element, etc.) without substantially increasing the cost, complexity, or IC die area of the MEMS sensor system over that associated with conventional MEMS sensor systems.

However, as further detailed below, various exemplary implementations can be applied to other areas of MEMS sensor signal processing, without departing from the subject matter described herein.

EXEMPLARY EMBODIMENTS

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

FIG. 1 depicts a functional block diagram of an exemplary MEMS sensor system or apparatus 100, in which a MEMS sensor element 102 facilitates generating multiple output signals (e.g., output signals 104a, 104b, . . . , 104n, etc.) with an associated integrated circuit (IC) 106 (e.g., an ASIC), according to various non-limiting embodiments. Various non-limiting embodiments of exemplary MEMS sensor system or apparatus 100 can comprise a MEMS sensor package comprising a MEMS sensor element 102. In a non-limiting example, exemplary MEMS sensor element 102 can comprise a motion sensor comprising a MEMS motion sensor element (e.g., a MEMS accelerometer, a MEMS gyroscope, etc.). As described above, various embodiments as described herein can be employed in any kind of motion sensor system (e.g., a MEMS motion sensor element such as an accelerometer, a gyroscope, etc.) or any other sensor system (e.g., a MEMS microphone sensor element, etc) that supports host systems or applications having two or more different sensor output data requirements (e.g., OIS data requirements, UI data requirements, etc.) from a single sensor element.

In a further non-limiting aspect, various embodiments as disclosed herein can comprise a single common signal path comprising an amplifier, an ADC, a first digital filter of two or more digital filters, and a second digital filter of the two or more digital filters. In another non-limiting aspect, various embodiments can facilitate providing two or more data outputs from the single common signal path by employing one or more MUXs configured to provide one or more output signals based on a selection from among electrical signals available along the single common signal path.

Accordingly, further non-limiting embodiments of exemplary MEMS sensor system or apparatus 100 can comprise an exemplary IC 106 (e.g., an IC disposed in the MEMS sensor package or otherwise) configured to receive an electrical signal from the MEMS sensor element 102, and comprising an electrical circuit comprising a single common signal path from the MEMS sensor element 102, as further described below, for example, regarding FIGS. 2-5. In a non-limiting aspect, the single common signal path can be configured to simultaneously provide a first output signal according to a first signal requirement and a second output signal according to a second signal requirement.

For example, in a non-limiting aspect, a first signal requirement and a second signal requirement can differ in one or more of a set of respective electrical characteristics comprising full-scale range, output data rate, latency, full-scale range (e.g., maximum signal that can be processed), a special filtering requirement, frequency response, and/or a signal standardization convention associated with the output data, and/or other output data requirement. In a further non-limiting aspect, an exemplary signal standardization convention can comprise signal requirements associated with $I^2C$ interface requirements, SPI requirements, or other signal standardization convention interface requirements, etc. In still further non-limiting implementations of exemplary MEMS sensor system or apparatus 100 comprising a MEMS sensor package including exemplary MEMS sensor element 102, exemplary IC 106 can be further configured to determine one or more of the first signal requirement or the second signal requirement based on a signal 108 received from a host system (not shown) comprising the MEMS sensor package, for example, as further described herein, regarding FIG. 10. As a non-limiting example, various embodiments of exemplary MEMS sensor system or apparatus 100 can comprise exemplary IC 106 that can be further configured to receive the signal 108 from the host system (not shown) and to simultaneously provide the first output signal and the second output signal based in part on the signal 108 from the host system (not shown).

In yet another non-limiting aspect, exemplary MEMS sensor system or apparatus 100 can comprise two or more signal outputs of the sensor package (e.g., two or more of output signals 104a, 104b, . . . , 104n, etc.) corresponding to the first output signal and the second output signal. As a non-limiting example, a single common signal path can comprise electrical circuitry comprising an amplifier operatively coupled to the MEMS sensor element 102, an ADC operatively coupled to the amplifier, and two or more digital filters operatively coupled to the ADC and configured to provide the electrical signals available along the single common signal path, as further described herein, for example, regarding FIGS. 2-5.

In a non-limiting aspect of exemplary IC 106, a single common signal path can comprise the analog amplifier, the ADC, a signal correction component (e.g., correction for gain, and/or offset, etc.), and multiple stages of digital filters. In another non-limiting aspect of the disclosed subject matter, one or more MUXs can be provided in exemplary IC 106 to select between outputs available at intermediate stages of multiple stages digital filters in a single common signal path while simultaneously providing two or more output signals to multiple hosts systems or applications, using a single MEMS sensor element 102 (e.g., a single MEMS motion sensor element, a single MEMS microphone element, etc.) without substantially increasing the cost, complexity, or IC 106 die area of the MEMS sensor system or apparatus 100 over that associated with conventional MEMS sensor systems.

As a non-limiting example, exemplary IC 106 can further comprise one or more signal multiplexers of exemplary IC 106 configured to provide an output signal corresponding to one of the first output signal and the second output signal based on a selection from among electrical signals available along the single common signal path, as further described herein. As a further non-limiting example, electrical signals available along the single common signal path can comprise two or more of a first signal at an output of the ADC, a second signal at an output of a first digital filter of the multiple stages of digital filters, or a third signal at an output of a second digital filter of the multiple stages of digital filters. In yet another non-limiting aspect of exemplary IC 106, one signal multiplexer of the one or more signal multiplexers can be further configured to determine one or more of a filtering characteristic or a data rate characteristic of the output signal corresponding to one of the first output signal and the second output signal based on a selection from among electrical signals available along the single common signal path, for example, as further described herein. In addition, in further non-limiting embodiments, exemplary IC 106 can further comprise another signal multiplexer configured to provide another output signal corresponding to the other of the first output signal and the second output signal, for example, as further described herein, regarding FIGS. 2 and 4. In yet another non-limiting aspect of exemplary IC 106, exemplary IC 106 can further comprise one or more of an exemplary first gain adjustment component 218 (e.g., a digital variable gain amplifier, etc.) of exemplary IC 106 configured to provide the first output signal according to the first signal requirement, and/or exemplary second gain adjustment component 220 (e.g., a digital variable gain amplifier, etc.) of exemplary IC 106 configured to provide the second output signal according to a second signal requirement, for example, as further described herein, regarding FIGS. 2-5.

Figure 4:
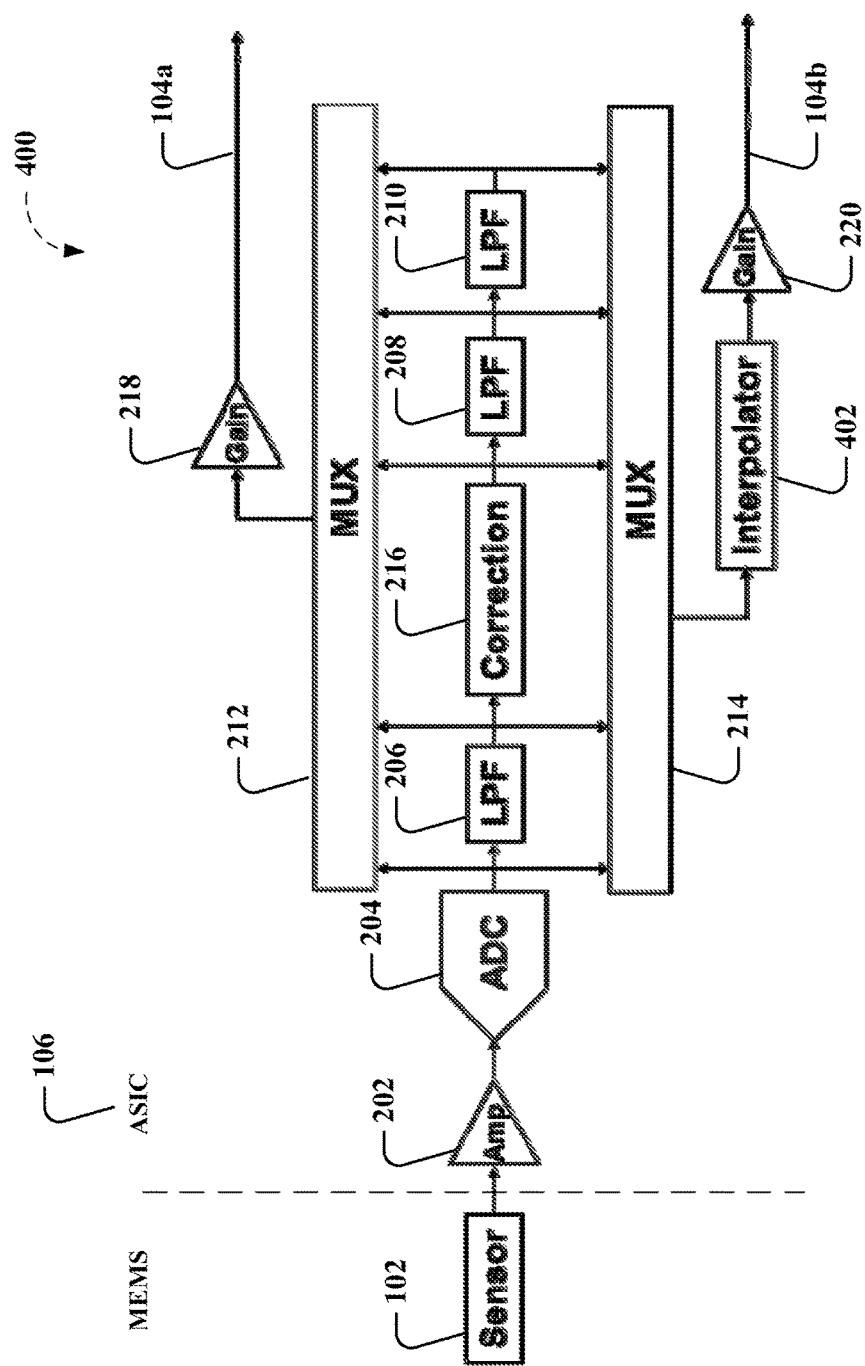
FIG. 4 depicts another functional block diagram of an exemplary MEMS sensor system or apparatus, in which one or more multiplexers (MUXs) of an associated IC can facilitate generating multiple output signals, according to further non-limiting embodiments.
Figure 5:
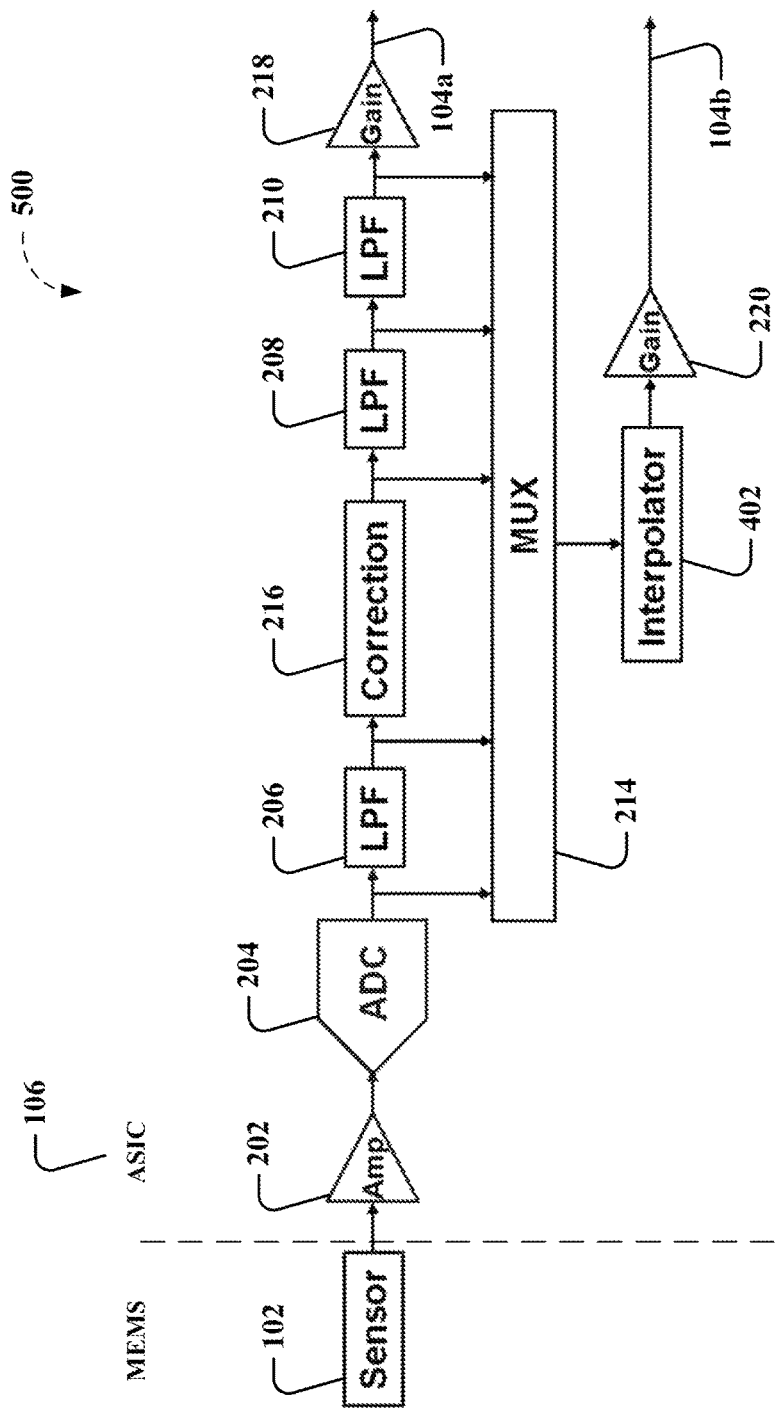
FIG. 5 depicts a further functional block diagram of an exemplary MEMS sensor system or apparatus, in which one MUX of an associated IC can facilitate generating multiple output signals, according to further non-limiting embodiments.

In yet another non-limiting aspect of the disclosed subject matter, exemplary IC 106 can further comprise one or more interpolators operatively coupled to respective ones of the one or more multiplexers configured to condition output signal corresponding to the first output signal and the second output signal, for example, as further described herein, regarding FIGS. 4-5.

Figure 2:
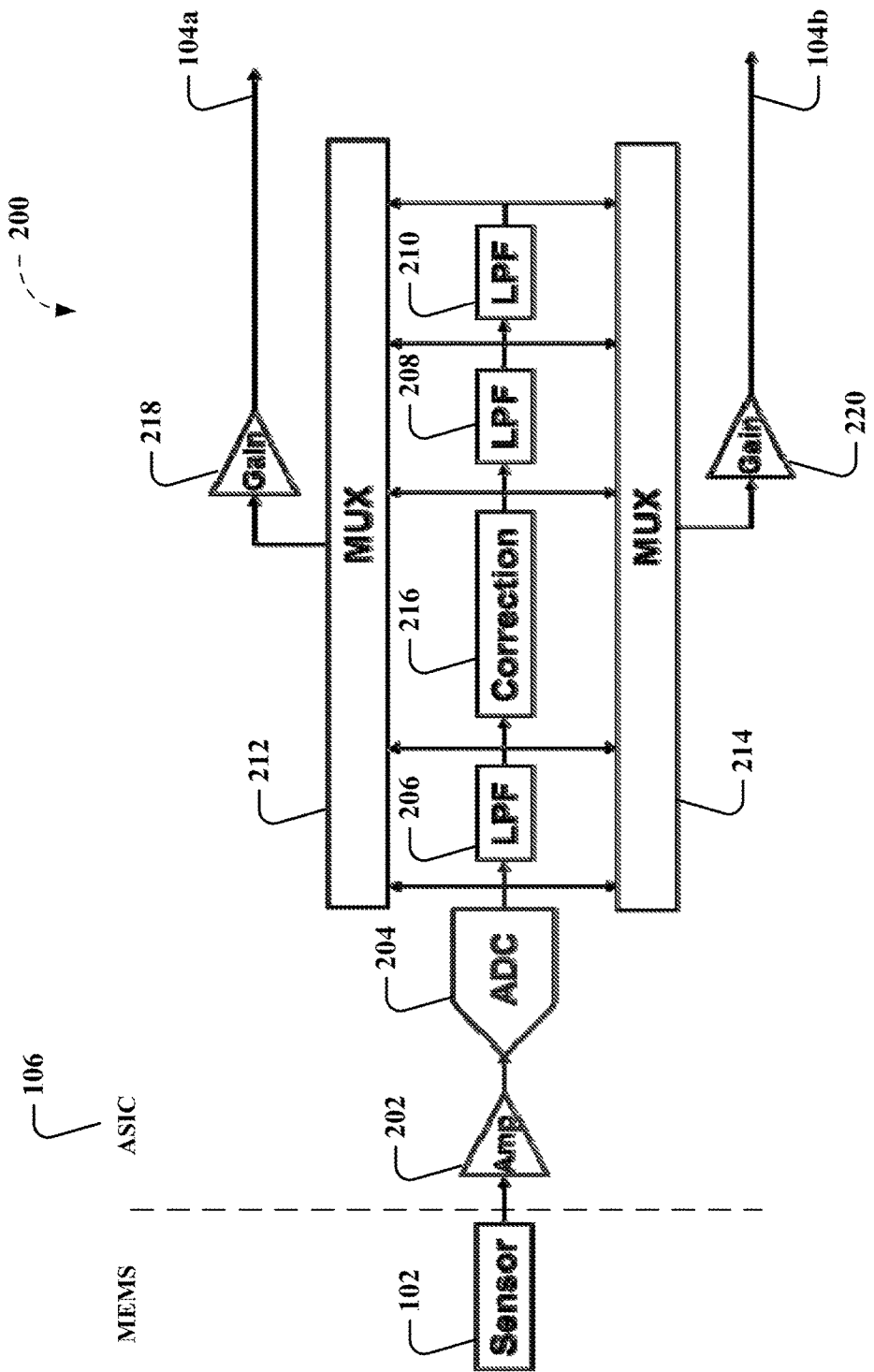
FIG. 2 depicts another functional block diagram of an exemplary MEMS sensor system or apparatus, in which one or more multiplexers (MUXs) of an associated IC can facilitate generating multiple output signals, according to further non-limiting embodiments.

FIG. 2 depicts another functional block diagram of an exemplary MEMS sensor system or apparatus 200, in which one or more exemplary MUXs of an associated exemplary IC 106 can facilitate generating multiple output signals (e.g., output signals 104a, 104b, . . . , 104n, etc.) with an associated integrated circuit (IC) 106 (e.g., an ASIC), according to various non-limiting embodiments. As described above regarding FIG. 1, non-limiting embodiments of exemplary MEMS sensor system or apparatus 200 can comprise a MEMS sensor package comprising a MEMS sensor element 102 (e.g., a MEMS motion sensor element such as an accelerometer, a gyroscope, etc.) or any other sensor system (e.g., a MEMS microphone sensor element, etc) that supports host systems or applications having two or more different sensor output data requirements (e.g., OIS data requirements, UI data requirements, etc.) from a single sensor element.

In a further non-limiting aspect, various embodiments as disclosed herein can comprise a single common signal path comprising an amplifier 202, an ADC 204, a first digital filter 206 (e.g., low pass filter (LPF)) of two or more digital filters (e.g., digital filter 206, digital filter 208, digital filter 210, etc.), and a second digital filter 208 or 210 (e.g., low pass filter (LPF)) of the two or more digital filters (e.g., digital filter 206, digital filter 208, digital filter 210, etc.). In another non-limiting aspect, various embodiments can facilitate providing two or more data outputs (e.g., output signals 104a, 104b, . . . , 104n, etc.) from the single common signal path by employing one or more MUXs (e.g., one or more of MUX 212 and MUX 214) configured to provide one or more output signals (e.g., output signals 104a, 104b, . . . , 104n, etc.) based on a selection from among electrical signals available along the single common signal path.

Accordingly, further non-limiting embodiments of exemplary MEMS sensor system or apparatus 200 can comprise an exemplary IC 106 (e.g., an IC disposed in the MEMS sensor package or otherwise) configured to receive an electrical signal from the MEMS sensor element 102, and comprising an electrical circuit comprising a single common signal path from the MEMS sensor element 102. In a non-limiting aspect, the single common signal path can be configured to simultaneously provide a first output signal (e.g., one of output signal 104a or output signal 104b) according to a first signal requirement and a second output signal (e.g., the other of output signal 104a or output signal 104b) according to a second signal requirement.

For example, in a non-limiting aspect, a first signal requirement and a second signal requirement can differ in one or more of a set of respective electrical characteristics comprising full-scale range, output data rate, latency, full-scale range (e.g., maximum signal that can be processed), a special filtering requirement, frequency response, and/or a signal standardization convention associated with the output data, and/or other output data requirement, as further described above. In a further non-limiting aspect, an exemplary signal standardization convention can comprise signal requirements associated with $I^2C$ interface requirements, SPI requirements, or other signal standardization convention interface requirements, etc. In still further non-limiting implementations of exemplary MEMS sensor system or apparatus 200 comprising a MEMS sensor package including exemplary MEMS sensor element 102, exemplary IC 106 can be further configured to determine one or more of the first signal requirement or the second signal requirement based on a signal 108 (not shown) received from a host system (not shown) comprising the MEMS sensor package, for example, as further described herein, regarding FIGS. 1-9. As a non-limiting example, various embodiments of exemplary MEMS sensor system or apparatus 200 can comprise exemplary IC 106 that can be further configured to receive the signal 108 (not shown) from the host system (not shown) and to simultaneously provide the first output signal (e.g., one of output signal 104a or output signal 104b) and the second output signal (e.g., the other of output signal 104a or output signal 104b) based in part on the signal 108 (not shown) from the host system (not shown).

In yet another non-limiting aspect, exemplary MEMS sensor system or apparatus 200 can comprise two or more signal outputs of the sensor package (e.g., two or more of output signals 104a, 104b, . . . , 104n, etc.) corresponding to the first output signal (e.g., one of output signal 104a or output signal 104b) and the second output signal (e.g., the other of output signal 104a or output signal 104b). As a non-limiting example, a single common signal path can comprise electrical circuitry comprising amplifier 202 operatively coupled to the MEMS sensor element 102, an ADC 204 operatively coupled to the amplifier 202, and two or more digital filters (e.g., two or more of digital filter 206, digital filter 208, digital filter 210, etc.) operatively coupled to the ADC 204 and configured to provide the electrical signals available along the single common signal path.

In another non-limiting aspect of exemplary IC 106, a single common signal path can comprise amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.). In another non-limiting aspect of the disclosed subject matter, the one or more MUXs (e.g., one or more of MUX 212 and MUX 214) provided in exemplary IC 106 can be configured to select between outputs available at intermediate stages of multiple stages digital filters (e.g., two or more of digital filter 206, digital filter 208, digital filter 210, etc.) in a single common signal path while simultaneously providing two or more output signals (e.g., two or more of output signals 104a, 104b, . . . , 104n, etc.) to multiple hosts systems or applications (not shown), using a single MEMS sensor element 102 (e.g., a single MEMS motion sensor element, a single MEMS microphone element, etc.) without substantially increasing the cost, complexity, or IC 106 die area of the MEMS sensor system or apparatus 200 over that associated with conventional MEMS sensor systems.

As a non-limiting example, exemplary IC 106 can further comprise one or more signal multiplexers (e.g., one or more of MUX 212 and MUX 214) of exemplary IC 106 configured to provide an output signal corresponding to one of the first output signal (e.g., one of output signal 104a or output signal 104b) or the second output signal (e.g., the other of output signal 104a or output signal 104b) based on a selection from among electrical signals available along the single common signal path, as further described herein. As a further non-limiting example, electrical signals available along the single common signal path can comprise two or more of a first signal at an output of the ADC 204, a second signal at an output of a first digital filter 206 of the multiple stages of digital filters (e.g., two or more of digital filter 206, digital filter 208, digital filter 210, etc.), or a third signal at an output of a second digital filter 208 of the multiple stages of digital filters (e.g., two or more of digital filter 206, digital filter 208, digital filter 210, etc.), and so on, for example, as depicted in FIG. 2.

In yet another non-limiting aspect of exemplary IC 106, one signal multiplexer (e.g., one of MUX 212 or MUX 214) of the one or more signal multiplexers (e.g., MUX 212 or MUX 214) can be further configured to determine one or more of a filtering characteristic (e.g., a signal corresponding to a collection of signals available from digital filter 206, digital filter 208, digital filter 210, etc.) or a data rate characteristic (data rate of an output signal) of the output signal (e.g., one of output signals 104a, 104b, . . . , 104n, etc.) corresponding to one of the first output signal (e.g., one of output signal 104a or output signal 104b) or the second output signal (e.g., the other of output signal 104a or output signal 104b) based on a selection from among electrical signals available along the single common signal path, for example, as further depicted in FIG. 2. For example, the one or more signal multiplexers (e.g., MUX 212 or MUX 214) can be further configured to determine a data rate characteristic (data rate of an output signal) of the output signal (e.g., one of output signals 104a, 104b, . . . , 104n, etc.), because as signals proceed through digital filter 206, digital filter 208, digital filter 210, etc., the data rate of an output signal will decrease. Thus, by selecting from among electrical signals available along the single common signal path, for example, as further depicted in FIG. 2, the one or more signal multiplexers (e.g., MUX 212 or MUX 214) can be further configured to determine one or more of a filtering characteristic (e.g., a signal corresponding to a collection of signals available from digital filter 206, digital filter 208, digital filter 210, etc.) or a data rate characteristic (data rate of an output signal) of the output signal (e.g., one of output signals 104a, 104b, . . . , 104n, etc.). In addition, in further non-limiting embodiments, exemplary IC 106 can further comprise another signal multiplexer (e.g., the other of MUX 212 or MUX 214) configured to provide another output signal (e.g., another of output signals 104a, 104b, . . . , 104n, etc.) corresponding to the other of the first output signal (e.g., one of output signal 104a or output signal 104b) and the second output signal (e.g., the other of output signal 104a or output signal 104b).

In yet another non-limiting aspect of exemplary IC 106, exemplary IC 106 can further comprise one or more of an exemplary first gain adjustment component 218 (e.g., one of digital variable gain amplifier 218, digital variable gain amplifier 220, etc.) of exemplary IC 106 configured to provide the first output signal (e.g., one of output signal 104a or output signal 104b) according to the first signal requirement, and/or exemplary second gain adjustment component 220 (e.g., another of digital variable gain amplifier 218, digital variable gain amplifier 220, etc.) of exemplary IC 106 configured to provide the second output signal (e.g., the other of output signal 104a or output signal 104b) according to a second signal requirement. Accordingly, exemplary first gain adjustment component 218 (e.g., variable gain amplifier 218) can be configured to provide a first output signal (e.g., one of output signal 104a or output signal 104b) according to the first signal requirement (e.g., a first full-scale range) and exemplary second gain adjustment component 220 (e.g., variable gain amplifier 220) can be configured to provide a second output signal (e.g., the other of output signal 104a or output signal 104b) according to a second signal requirement (e.g., a second full-scale range different from the first full-scale range).

It can be understood that while exemplary MEMS sensor system or apparatus 100, 200, etc. can be configured to provide a first output signal (e.g., one of output signal 104a or output signal 104b) according to the first signal requirement (e.g., a first full-scale range, a first ODR, etc.) and a second output signal (e.g., the other of output signal 104a or output signal 104b) according to a second signal requirement (e.g., a second full-scale range different from the first full-scale range, a second ODR different from the first ODR, etc.) the one or more signal multiplexers (e.g., MUX 212 or MUX 214) can provide the first output signal (e.g., one of output signal 104a or output signal 104b) according to the first signal requirement and/or the second output signal (e.g., the other of output signal 104a or output signal 104b) according to a second signal requirement where the full-scale ranges can be different, and where the ODRs of the output signals (e.g., output signal 104a and output signal 104b) can be different. However, note that while the ODRs of the output signals (e.g., output signal 104a and output signal 104b) can be different, the ODRs of the output signals (e.g., output signal 104a and output signal 104b) would be related to the ADC 204 clock frequency (e.g., both ODRs would be a sub-multiple of the ADC clock frequency), because the output signals (e.g., output signal 104a and output signal 104b) can be derived from the single common signal path comprising the ADC 204.

Figure 3:
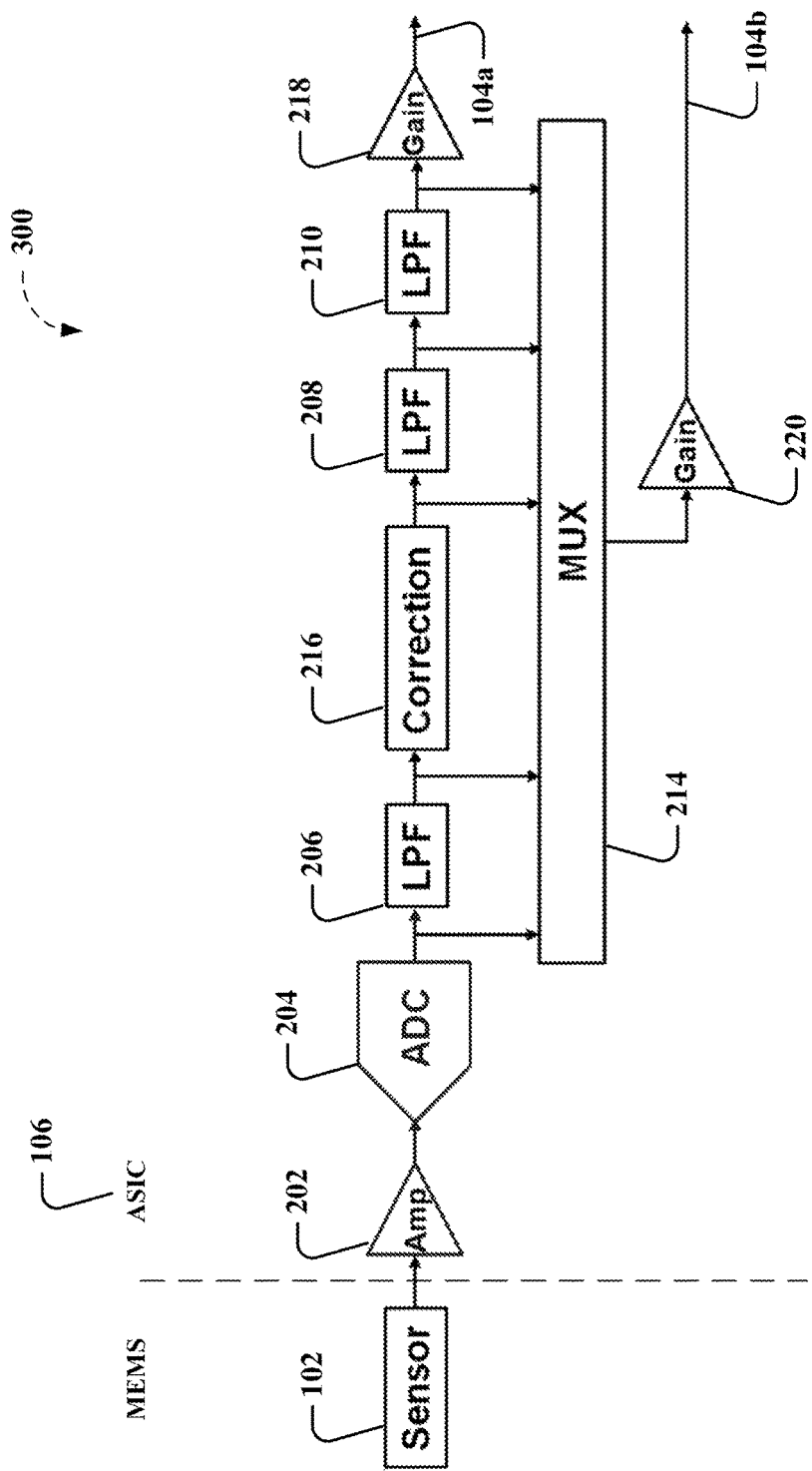
FIG. 3 depicts a further functional block diagram of an exemplary MEMS sensor system or apparatus, in which one MUX of an associated IC can facilitate generating multiple output signals, according to further non-limiting embodiments.

FIG. 3 depicts a further functional block diagram of an exemplary MEMS sensor system or apparatus 300, in which one MUX 214 of an associated IC 106 can facilitate generating multiple output signals (e.g., output signals 104a, 104b, . . . , 104n, etc.), according to further non-limiting embodiments. It is noted that exemplary MEMS sensor system or apparatus 300 is a special case of exemplary MEMS sensor system or apparatus 200 of FIG. 2 comprising one MUX 214, in which like reference characters are employed to infer similar functionality as that described above regarding FIGS. 1-2. Accordingly, it can be understood that a single common signal path comprising amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.) can be configured to provide a first output signal (e.g., output signal 104a) according to a first signal requirement, whereas exemplary MUX 214 can be configured to select between outputs available at intermediate stages of multiple stages digital filters (e.g., two or more of digital filter 206, digital filter 208, digital filter 210, etc.) in the single common signal path to simultaneously provide a second output signal (e.g., output signal 104b) according to a second signal requirement, as further described above regarding FIGS. 1-2, for example.

Thus, exemplary IC 106 comprising an exemplary first gain adjustment component 218 (e.g., digital variable gain amplifier 218) of exemplary IC 106 can be configured to provide the first output signal (e.g., one of output signal 104a or output signal 104b) according to the first signal requirement, while exemplary second gain adjustment component 220 (e.g., digital variable gain amplifier 220) of exemplary IC 106 configured to provide the second output signal (e.g., output signal 104b) according to a second signal requirement. Accordingly, exemplary first gain adjustment component 218 (e.g., variable gain amplifier 218) can be configured to provide a first output signal (e.g., one of output signal 104a or output signal 104b) according to the first signal requirement (e.g., a first full-scale range) and exemplary second gain adjustment component 220 (e.g., variable gain amplifier 220) can be configured to provide a second output signal (e.g., the other of output signal 104a or output signal 104b) according to a second signal requirement (e.g., a second full-scale range different from the first full-scale range). As described above regarding FIG. 2, the ODRs of the output signals (e.g., output signal 104a and output signal 104b) are different, but would be related to the ADC 204 clock frequency (e.g., both ODRs would be a sub-multiple of the ADC clock frequency), because the output signals (e.g., output signal 104a and output signal 104b) can be derived from the single common signal path comprising the ADC 204.

Accordingly, in yet another non-limiting aspect of the disclosed subject matter, exemplary IC 106 can further comprise one or more interpolators operatively coupled to respective ones of the one or more multiplexers configured to condition an output signal (e.g., one of output signals 104a, 104b, . . . , 104n, etc.) corresponding to the first output signal and the second output signal, for example, as further described herein, regarding FIGS. 4-5.

FIG. 4 depicts another functional block diagram of an exemplary MEMS sensor system or apparatus 400, in which one or more multiplexers (MUXs) of an associated IC 106 can facilitate generating multiple output signals (e.g., output signals 104a, 104b, . . . , 104n, etc.), according to further non-limiting embodiments. It is noted that exemplary MEMS sensor system or apparatus 400 is a special case of exemplary MEMS sensor system or apparatus 200 of FIG. 2 comprising one or more MUXs (e.g., one or more of MUX 212 and MUX 214) configured to provide one or more output signals (e.g., output signals 104a, 104b, . . . , 104n, etc.) based on a selection from among electrical signals available along the single common signal path, in which like reference characters are employed to infer similar functionality as that described above regarding FIGS. 1-2. Accordingly, it can be understood that a single common signal path comprising amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.) in conjunction with MUX 212 can be configured to provide a first output signal (e.g., output signal 104a) according to a first signal requirement, whereas exemplary MUX 214 can be configured to select between outputs available at intermediate stages of multiple stages digital filters (e.g., two or more of digital filter 206, digital filter 208, digital filter 210, etc.) in the single common signal path to simultaneously provide a second output signal (e.g., output signal 104b) according to a second signal requirement, as further described above regarding FIGS. 1-2, for example.

As described above, in another non-limiting aspect of the disclosed subject matter, exemplary IC 106 can further comprise one or more interpolators (e.g., interpolator 402, etc.) operatively coupled to respective ones of the one or more multiplexers (e.g., one or more of MUX 212 and MUX 214) configured to condition an output signal (e.g., one of output signals 104a, 104b, . . . , 104n, etc.) corresponding to the first output signal (e.g., output signal 104a) and the second output signal (e.g., output signal 104b). Accordingly, exemplary MEMS sensor system or apparatus 400 comprising one or more interpolators (e.g., interpolator 402, etc.) operatively coupled to respective ones of the one or more multiplexers (e.g., one or more of MUX 212 and MUX 214) configured to condition an output signal (e.g., one of output signals 104a, 104b, . . . , 104n, etc.) by conditioning a signal with a given clock frequency to a different clock frequency. Thus, in a further non-limiting aspect, one or more interpolators (e.g., interpolator 402, etc.) can be operatively coupled to the one or more multiplexers (e.g., one or more of MUX 212 and MUX 214) and configured to condition the one or more output signals (e.g., one or more of output signals 104a, 104b, . . . , 104n, etc.) to alter a respective output data rate for an output signal (e.g., one output signals 104a, 104b, . . . , 104n, etc.).

In addition, exemplary IC 106 comprising an exemplary first gain adjustment component 218 (e.g., digital variable gain amplifier 218) of exemplary IC 106 can be configured to provide the first output signal (e.g., one of output signal 104a or output signal 104b) according to the first signal requirement, while exemplary second gain adjustment component 220 (e.g., digital variable gain amplifier 220) of exemplary IC 106 configured to provide the second output signal (e.g., output signal 104b) according to a second signal requirement. Accordingly, exemplary first gain adjustment component 218 (variable gain amplifier 218) can be configured to provide a first output signal (e.g., one of output signal 104a or output signal 104b) according to the first signal requirement (e.g., a first full-scale range) and exemplary second gain adjustment component 220 (e.g., variable gain amplifier 220) can be configured to simultaneously provide a second output signal (e.g., the other of output signal 104a or output signal 104b) according to a second signal requirement (e.g., a second full-scale range different from the first full-scale range). As described above regarding FIG. 2, the ODRs of the output signals (e.g., output signal 104a and output signal 104b) can be different, but would not necessarily be related to the ADC 204 clock frequency, because exemplary IC 106 comprising one or more interpolators (e.g., interpolator 402, etc.) operatively coupled to respective ones of the one or more multiplexers (e.g., one or more of MUX 212 and MUX 214) can be configured to condition an output signal (e.g., one of output signals 104a, 104b, . . . , 104n, etc.) by conditioning a signal with a given clock frequency to a different clock frequency. Accordingly, exemplary MEMS sensor system or apparatus 400 can be configured to generate multiple output signals (e.g., output signals 104a, 104b, . . . , 104n, etc.) derived from the single common signal path, where each of the output signals (e.g., output signals 104a, 104b, . . . , 104n, etc.) can have independent full-scale range, ODR, filtering requirement, and so on, according to differences among respective output data requirements, as further described herein.

FIG. 5 depicts a further functional block diagram of an exemplary MEMS sensor system or apparatus 500, in which one MUX of an associated IC 106 can facilitate generating multiple output signals (e.g., output signals 104a, 104b, . . . , 104n, etc.), according to further non-limiting embodiments. It is noted that exemplary MEMS sensor system or apparatus 400 is a special case of exemplary MEMS sensor system or apparatus 400 of FIG. 4 comprising one or more MUXs (e.g., one or more of MUX 212 and MUX 214) configured to provide one or more output signals (e.g., output signals 104a, 104b, . . . , 104n, etc.) based on a selection from among electrical signals available along the single common signal path, in which like reference characters are employed to infer similar functionality as that described above regarding FIGS. 1-2 and 4. Accordingly, it can be understood that a single common signal path comprising amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.) can be configured to provide a first output signal (e.g., output signal 104a) according to a first signal requirement, whereas exemplary MUX 214 can be configured to select between outputs available at intermediate stages of multiple stages digital filters (e.g., two or more of digital filter 206, digital filter 208, digital filter 210, etc.) in the single common signal path to simultaneously provide a second output signal (e.g., output signal 104b) according to a second signal requirement, as further described above regarding FIGS. 1-3, for example.

Thus, exemplary IC 106 comprising an exemplary first gain adjustment component 218 (e.g., digital variable gain amplifier 218) of exemplary IC 106 can be configured to provide the first output signal (e.g., one of output signal 104a or output signal 104b) according to the first signal requirement, while exemplary second gain adjustment component 220 (e.g., digital variable gain amplifier 220) of exemplary IC 106 configured to provide the second output signal (e.g., output signal 104b) according to a second signal requirement. Accordingly, exemplary first gain adjustment component 218 (e.g., variable gain amplifier 218) can be configured to provide a first output signal (e.g., one of output signal 104a or output signal 104b) according to the first signal requirement (e.g., a first full-scale range) and exemplary second gain adjustment component 220 (e.g., variable gain amplifier 220) can be configured to provide a second output signal (e.g., the other of output signal 104a or output signal 104b) according to a second signal requirement (e.g., a second full-scale range different from the first full-scale range).

As described above regarding FIGS. 2 and 4, the ODRs of the output signals (e.g., output signal 104a and output signal 104b) can be different, but would not necessarily be related to the ADC 204 clock frequency, because exemplary IC 106 comprising one or more interpolators (e.g., interpolator 402, etc.) operatively coupled to respective ones of the one or more multiplexers (e.g., one or more of MUX 212 and MUX 214) can be configured to condition an output signal (e.g., one of output signals 104a, 104b, . . . , 104n, etc.) by conditioning a signal with a given clock frequency to a different clock frequency. Accordingly, exemplary MEMS sensor system or apparatus 500 can be configured to generate multiple output signals (e.g., output signals 104a, 104b, . . . , 104n, etc.) derived from the single common signal path, where each of the output signals (e.g., output signals 104a, 104b, . . . , 104n, etc.) can have independent full-scale range, ODR, filtering requirement, and so on, according to differences among respective output data requirements, as further described herein.

Accordingly, exemplary MEMS sensor systems or apparatuses 100, 200, 300, 400, 500, etc. as described herein can facilitate providing two or more output data streams (e.g., output signals 104a, 104b, . . . , 104n, etc.) to two or more host systems or applications from a single MEMS sensor element 102 having a single common signal path, where each host system or application requires a data stream having at least one unique output data requirement (e.g., between the two or more data streams), such as output data rate (ODR), latency, full-scale range (e.g., maximum signal that can be processed), a special filtering requirement, frequency response, and/or a signal standardization convention associated with the output data (e.g., Inter-Integrated Circuit ($I^2C$) interface requirements, Serial Peripheral Interface (SPI) requirements, etc.), and/or other output data requirement. For example, in addition to one or more interpolators (e.g., interpolator 402, etc.) operatively coupled to respective ones of the one or more multiplexers (e.g., one or more of MUX 212 and MUX 214), various embodiments as described herein can employ special filtering (e.g., at one or more one or more input or output of the one or more of MUX 212 and MUX 214) (not shown) to facilitate generating multiple output signals (e.g., output signals 104a, 104b, . . . , 104n, etc.) with an associated integrated circuit (IC) 106 to further provide output signals (e.g., output signals 104a, 104b, . . . , 104n, etc.) that meet a particular filtering output data requirement.

In addition, exemplary MEMS sensor systems or apparatuses 100, 200, 300, 400, 500, etc. as described herein can facilitate simultaneously providing two or more output data streams (e.g., output signals 104a, 104b, . . . , 104n, etc.) to two or more host systems or applications from a single MEMS sensor element 102 having a single common signal path. As a non-limiting example of simultaneously providing two or more output data streams (e.g., output signals 104a, 104b, . . . , 104n, etc.) to two or more host systems or applications from a single MEMS sensor element 102, consider exemplary MEMS sensor systems or apparatuses 100, 200, 300, 400, 500, etc. supporting OIS and a UI of a host system comprising a mobile device that may be required to provide to multiple data outputs, simultaneously (e.g., one to track user input for the UI, another to determine orientation of the mobile device, and/or another to provide a data output for OIS when taking a picture, etc.), where each data output can have different output data requirements. Thus, two or more data outputs (e.g., output signals 104a, 104b, . . . , 104n, etc.) can be provided according to various exemplary embodiments described herein at the same time to two or more host systems, applications, or processes having two or more different sensor output data requirements.

While simultaneous support of multiple host systems, applications, or processes can be provided by various embodiments of exemplary MEMS sensor systems or apparatuses 100, 200, 300, 400, 500, etc., it is noted that each of the two or more data outputs (e.g., output signals 104a, 104b, . . . , 104n, etc.) can be operated independently without resource sharing (e.g., time multiplexing of data on an output, etc.) beyond exemplary first gain adjustment component 218 (e.g., digital variable gain amplifier 218) and exemplary second gain adjustment component 220 (e.g., digital variable gain amplifier 220) of exemplary IC 106. That is, each of the two or more data outputs (e.g., output signals 104a, 104b, . . . , 104n, etc.) are not reliant on resource sharing (e.g., time multiplexing of data on an output, etc.) for simultaneous operation of the two or more data outputs (e.g., output signals 104a, 104b, . . . , 104n, etc.). However, in further non-limiting aspects, various embodiments of exemplary MEMS sensor systems or apparatuses 100, 200, 300, 400, 500, etc. can employ resource sharing (e.g., time multiplexing of data on an output, etc.) for at least two of the two or more data outputs (e.g., output signals 104a, 104b, . . . , 104n, etc.) on a single data output, while simultaneously providing at least one other data output (e.g., one or output signals 104a, 104b, . . . , 104n, etc.) independent of any resource sharing.

For example, as further described below regarding FIG. 10, it may be desirable to turn off a number of blocks of various embodiments of exemplary MEMS sensor systems or apparatuses 200, 300, 400, 500, etc. to save power (e.g., blocks associated with a data output associated with OIS, etc.). In such a situation, two of the two or more data outputs (e.g., output signals 104a, 104b, . . . , 104n, etc.) can employ resource sharing (e.g., time multiplexing of data on an output, etc.) on a single data output, while simultaneously providing at least one other data output (e.g., one or output signals 104a, 104b, . . . , 104n, etc.) independent of any resource sharing.

Figure 10:
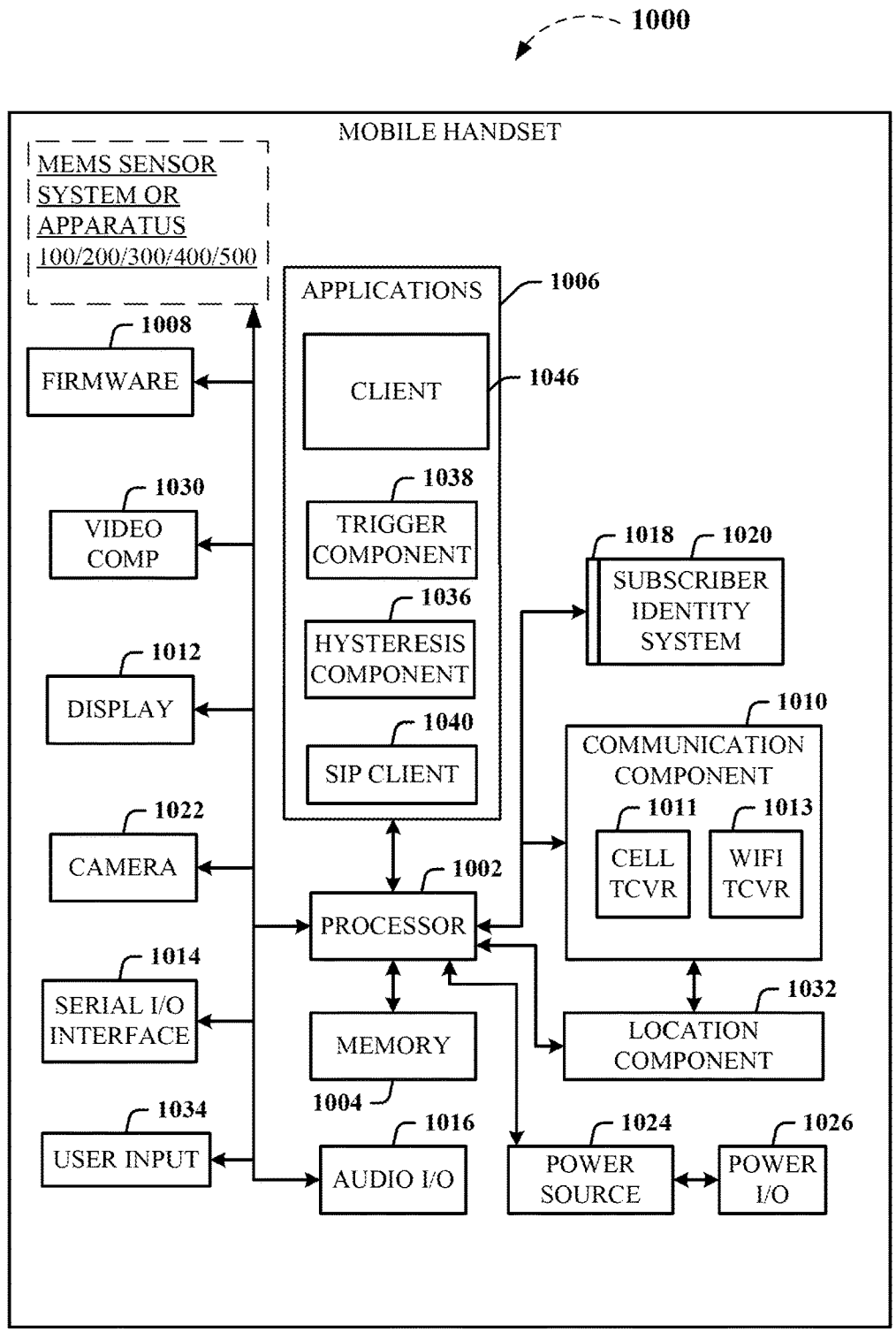
FIG. 10 illustrates a schematic diagram of an exemplary mobile device (e.g., a mobile handset) that can facilitate various non-limiting aspects of the subject disclosure in accordance with the embodiments described herein.

In another non-limiting aspect as described above, in various embodiments of exemplary MEMS sensor systems or apparatuses 200, 300, 400, 500, etc., exemplary IC 106 can be further configured to determine one or more of the first signal requirement or the second signal requirement based on a signal 108 received from a host system (not shown) comprising the MEMS sensor package, for example, as further described herein, regarding FIG. 10. As a non-limiting example, various embodiments of exemplary MEMS sensor system or apparatus 100 can comprise exemplary IC 106 that can be further configured to receive the signal 108 from the host system (not shown) and to simultaneously provide the first output signal and the second output signal based in part on the signal 108 from the host system (not shown). For example, in addition to turning off blocks to save power, various blocks of exemplary MEMS sensor systems or apparatuses 200, 300, 400, 500, etc. can be host system or application configurable. As non-limiting examples, various embodiments of MEMS sensor systems or apparatuses 100, 200, 300, 400, 500, etc. comprising exemplary IC 106 can comprise one or more of a programmable MUX, a programmable filter, a programmable amplifier, and so on to facilitate host system or application configurability of one or more of the data outputs (e.g., output signals 104a, 104b, . . . , 104n, etc.) according to an output data requirement.

In yet another non-limiting aspect as described above, it can be understood that various embodiments of exemplary MEMS sensor systems or apparatuses 100, 200, 300, 400, 500, etc. can be employed on each signal or certain ones of an X-axis, a Y-axis, and/or a Z-axis of a multi-axis MEMS motion sensor element (e.g., an accelerometer, a gyroscope, etc.).

Accordingly, in various non-limiting implementations, the disclosed subject matter provides an apparatus comprising an exemplary MEMS sensor (e.g., MEMS sensor element 102 of exemplary MEMS sensor systems or apparatuses 100, 200, 300, 400, 500, etc.) that facilitates generating multiple output signals (e.g., output signals 104a, 104b, . . . , 104n, etc.) with an associated IC (e.g., exemplary IC 106), according to various non-limiting embodiments, for example, as further described above regarding FIGS. 1-5. As a non-limiting example, an exemplary apparatus can comprise a MEMS sensor package (e.g., a sensor package comprising MEMS sensor element 102 of exemplary MEMS sensor systems or apparatuses 100, 200, 300, 400, 500, etc.) comprising a MEMS sensor (e.g., MEMS sensor element 102 of exemplary MEMS sensor systems or apparatuses 100, 200, 300, 400, 500, etc.). In a non-limiting aspect, an exemplary apparatus as described herein can comprise a MEMS motion sensor (e.g., MEMS sensor element 102 of exemplary MEMS sensor systems or apparatuses 100, 200, 300, 400, 500, etc.) comprising a MEMS accelerometer, a MEMS gyroscope, or any other sensor system (e.g., a MEMS microphone sensor system, etc) that supports host systems or applications having two or more different sensor output data requirements from a single sensor element, and/or portions thereof such as each signal of an X-axis, a Y-axis, and/or a Z-axis of a multi-axis MEMS motion sensor element (e.g., an accelerometer, a gyroscope, etc.).

In a further non-limiting example, an exemplary apparatus can further comprise an IC (e.g., exemplary IC 106) disposed in the MEMS sensor package, which can be configured to receive an electrical signal from the MEMS sensor (e.g., MEMS sensor element 102 of exemplary MEMS sensor systems or apparatuses 100, 200, 300, 400, 500, etc.), which can comprise an electrical circuit comprising a single common signal path from the MEMS sensor, and which can be configured to simultaneously provide one or more of a first output signal (e.g., one of output signal 104a or output signal 104b) according to a first signal requirement and a second output signal (e.g., the other of output signal 104a or output signal 104b) according to a second signal requirement. In a non-limiting aspect, an exemplary single common signal path can comprise electrical circuitry, which can comprise amplifier 202 (e.g., analog amplifier 202), ADC 204, and multiple stages of digital filters (e.g., two or more of digital filter 206, digital filter 208, digital filter 210, etc.), for example, as described above regarding FIGS. 2-5. In another non-limiting aspect, an exemplary single common signal path can comprise electrical circuitry, which can further comprise amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.), as further described above. In still another non-limiting aspect, an exemplary single common signal path can comprise electrical circuitry, which can comprise an amplifier (e.g., analog amplifier 202) operatively coupled to the MEMS sensor (e.g., MEMS sensor element 102 of exemplary MEMS sensor systems or apparatuses 100, 200, 300, 400,

500, etc.), an analog-to-digital converter (e.g., ADC 204) operatively coupled to the amplifier e.g., analog amplifier 202), and two or more filters (e.g., two or more of digital filter 206, digital filter 208, digital filter 210, etc.) operatively coupled to the ADC (e.g., ADC 204), and which can be configured to provide the electrical signals available along the single common signal path. As a non-limiting example, exemplary electrical signals available along the single common signal path can comprise two or more of a first signal at an output of the ADC (e.g., ADC 204), a second signal at an output of a first digital filter (e.g., one of digital filter 206, digital filter 208, digital filter 210, etc.) of the two or more filters (e.g., two or more of digital filter 206, digital filter 208, digital filter 210, etc.), or a third signal at an output of a second digital filter (e.g., another of digital filter 206, digital filter 208, digital filter 210, etc.) of the two or more filters (e.g., two or more of digital filter 206, digital filter 208, digital filter 210, etc.).

As described above, an exemplary apparatus can comprise an IC (e.g., exemplary IC 106) disposed in the MEMS sensor package, which can be configured to receive an electrical signal from the MEMS sensor (e.g., MEMS sensor element 102 of exemplary MEMS sensor systems or apparatuses 100, 200, 300, 400, 500, etc.), which can comprise an electrical circuit comprising a single common signal path from the MEMS sensor, and which can be configured to simultaneously provide one or more of a first output signal (e.g., one of output signal 104a or output signal 104b) according to a first signal requirement and a second output signal (e.g., the other of output signal 104a or output signal 104b) according to a second signal requirement. As a non-limiting example, in non-limiting aspects the first signal requirement and the second signal requirement can differ in one or more of a set of respective electrical characteristics output data rate, latency, full-scale range (e.g., maximum signal that can be processed), a special filtering requirement, frequency response, and/or a signal standardization convention, etc., associated with the first output signal (e.g., one of output signal 104a or output signal 104b) and the second output signal (e.g., the other of output signal 104a or output signal 104b). In a further non-limiting aspect, signal standardization convention can comprise one or more of I²C interface requirements, SPI requirements, etc. In still further non-limiting embodiments of the disclosed subject matter, an exemplary apparatus as described herein can be configured to determine one or more of the first signal requirement or the second signal requirement based on a signal (e.g., signal 108) received from a host system (not shown) comprising the MEMS sensor package (e.g., a sensor package comprising MEMS sensor element 102 of exemplary MEMS sensor systems or apparatuses 100, 200, 300, 400, 500, etc.), for example, as further described herein, regarding FIG. 10. In still other non-limiting embodiments of the disclosed subject matter, an exemplary apparatus as described herein can be further configured to receive the signal (e.g., signal 108) from the host system (not shown) and to simultaneously provide the one or more of the first output signal (e.g., one of output signal 104a or output signal 104b) or the second output signal (e.g., the other of output signal 104a or output signal 104b) based on the signal (e.g., signal 108) from the host system (not shown), for example, as further described herein, regarding FIG. 10.

Accordingly, an exemplary apparatus as described herein can further comprise two or more signal outputs (e.g., two or more signal outputs corresponding to two or more of output signals 104a, 104b, . . . , 104n, etc.) of the sensor package corresponding to the one or more of the first output signal (e.g., one of output signal 104a or output signal 104b) and the second output signal (e.g., the other of output signal 104a or output signal 104b).

In another non-limiting aspect, an exemplary apparatus as described herein can further comprise one or more signal multiplexers (e.g., one or more of multiplexers, MUX 212, MUX 214, etc.) of the IC (e.g., IC 106), which can be configured to provide an output signal (e.g., one of output signals 104a, 104b, . . . , 104n, etc.) corresponding to one of the one or more of first output signal (e.g., one of output signal 104a or output signal 104b) or second output signal (e.g., the other of output signal 104a or output signal 104b) based on a selection from among electrical signals available along the single common signal path. In yet another non-limiting aspects, exemplary apparatus can further comprise the one or more signal multiplexers (e.g., one or more of multiplexers, MUX 212, MUX 214, etc.) of the IC (e.g., IC 106), which can be configured to determine one or more of a filtering characteristic (e.g., a signal corresponding to a collection of signals available from digital filter 206, digital filter 208, digital filter 210, etc.) or a data rate characteristic (data rate of an output signal) of the output signal (e.g., one of output signals 104a, 104b, . . . , 104n, etc.) corresponding to one of the one or more of the first output signal (e.g., one of output signal 104a or output signal 104b) and the second output signal (e.g., the other of output signal 104a or output signal 104b) based on the selection from among electrical signals available along the single common signal path. In still another non-limiting aspect, an exemplary apparatus as described herein can further comprise a second signal multiplexer (e.g., another of the one or more of multiplexers, MUX 212, MUX 214, etc.) of the IC (e.g., exemplary IC 106), which can be configured to provide another output signal (e.g., another one of output signals 104a, 104b, . . . , 104n, etc.) corresponding to the other of the one or more of the first output signal (e.g., one of output signal 104a or output signal 104b) or the second output signal (e.g., the other of output signal 104a or output signal 104b).

In still other non-limiting embodiments of the disclosed subject matter, an exemplary apparatus as described herein can further comprise a first gain adjustment component (e.g., an exemplary gain adjustment component, such as, one of digital variable gain amplifier 218, digital variable gain amplifier 220, etc. of exemplary IC 106) of the IC (e.g., exemplary IC 106), which can be configured to provide the first output signal (e.g., one of output signal 104a or output signal 104b) according to the first signal requirement. In yet other non-limiting embodiments, an exemplary apparatus as described herein can further comprise a second gain adjustment component (e.g., another exemplary gain adjustment component, such as, another of digital variable gain amplifier 218, digital variable gain amplifier 220, etc. of exemplary IC 106) of the IC (e.g., exemplary IC 106), which can be configured to provide the second output signal (e.g., the other of output signal 104a or output signal 104b) according to the second signal requirement.

In further non-limiting embodiments, an exemplary apparatus as described herein can further comprise an interpolator (e.g., an interpolator, such as, interpolator 402, etc.) of the IC (e.g., exemplary IC 106) operatively coupled to one of the one or more multiplexer (e.g., operatively coupled to a respective one of the one or more multiplexers, MUX 212 or MUX 214), which can be configured to condition the output signal (e.g., one of output signals 104a, 104b, . . . , 104n, etc.) corresponding to one of the first output signal (e.g., one of output signal 104*a* or output signal 104*b*) or the second output signal (e.g., the other of output signal 104*a* or output signal 104*b*).

In addition, in other non-limiting implementations, the disclosed subject matter provides sensor system comprising an exemplary MEMS sensor package (e.g., a sensor package comprising a MEMS sensor element 102 of exemplary MEMS sensor systems or apparatuses 100, 200, 300, 400, 500, etc.) that facilitates generating multiple output signals (e.g., output signals 104*a*, 104*b*, . . . , 104*n*, etc.) with an associated IC (e.g., exemplary IC 106), according to various non-limiting embodiments, for example, as further described above regarding FIGS. 1-5. As a non-limiting example, an exemplary system can comprise a MEMS sensor package (e.g., a sensor package comprising MEMS sensor element 102 of exemplary MEMS sensor systems or apparatuses 100, 200, 300, 400, 500, etc.) comprising a MEMS sensor (e.g., MEMS sensor element 102 of exemplary MEMS sensor systems or apparatuses 100, 200, 300, 400, 500, etc.), wherein the MEMS sensor is configured to provide an electrical signal. In another non-limiting aspect, an exemplary system can comprise a MEMS motion sensor (e.g., MEMS sensor element 102 of exemplary MEMS sensor systems or apparatuses 100, 200, 300, 400, 500, etc.) comprising a MEMS accelerometer, a MEMS gyroscope, any other sensor system (e.g., a MEMS microphone sensor system, etc) that supports host systems or applications having two or more different sensor output data requirements from a single sensor element, and/or portions thereof such as each signal of an X-axis, a Y-axis, and/or a Z-axis of a multi-axis MEMS motion sensor element (e.g., an accelerometer, a gyroscope, etc.).

In a non-limiting aspect, an exemplary system as described herein can comprise means for processing (e.g., exemplary IC 106, or portions thereof, etc.) the electrical signal and for simultaneously providing (e.g., exemplary IC 106, or portions thereof, etc.) a first output signal (e.g., one of output signal 104*a* or output signal 104*b*) according to a first signal requirement and a second output signal (e.g., the other of output signal 104*a* or output signal 104*b*) according to a second signal requirement.

In yet another non-limiting aspect, an exemplary system as described herein can further comprise means for determining (e.g., exemplary IC 106, or portions thereof, etc.) the first signal requirement or the second signal requirement and means for selecting (e.g., exemplary IC 106, or portions thereof, etc., such as e.g., one of multiplexers, MUX 212, MUX 214, etc.) from among electrical signals available in a signal common signal path associated with the MEMS sensor to provide an output signal (e.g., one of output signals 104*a*, 104*b*, . . . , 104*n*, etc.) corresponding to one of the first output signal (e.g., one of output signal 104*a* or output signal 104*b*) and the second output signal (e.g., the other of output signal 104*a* or output signal 104*b*) based on a selection from among the electrical signals. In a non-limiting aspect, an exemplary single common signal path can comprise amplifier 202 (e.g., analog amplifier 202), ADC 204, and multiple stages of digital filters (e.g., two or more of digital filter 206, digital filter 208, digital filter 210, etc.), for example, as described above regarding FIGS. 2-5. In another non-limiting aspect, an exemplary single common signal path can comprise amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.), as further described above.

In yet another non-limiting aspect, an exemplary system as described herein can further comprise means for providing (e.g., exemplary IC 106, or portions thereof, etc.) the first output signal (e.g., one of output signal 104*a* or output signal 104*b*) having a first set of electrical characteristics (e.g., a set of output data rate, latency, full-scale range (e.g., maximum signal that can be processed, etc.), a special filtering requirement, frequency response, and/or a signal standardization convention) and means for simultaneously providing (e.g., exemplary IC 106, or portions thereof, etc.) the second output signal (e.g., the other of output signal 104*a* or output signal 104*b*) having a second set of electrical characteristics (e.g., a set of output data rate, latency, full-scale range (e.g., maximum signal that can be processed), a special filtering requirement, frequency response, and/or a signal standardization convention, etc.), wherein a subset of the first set of electrical characteristics (e.g., a set of output data rate, latency, full-scale range (e.g., maximum signal that can be processed, etc.), a special filtering requirement, frequency response, and/or a signal standardization convention) differs from a subset of the second set of electrical characteristics (e.g., a set of output data rate, latency, full-scale range (e.g., maximum signal that can be processed), a special filtering requirement, frequency response, and/or a signal standardization convention, etc.) according to a difference between the first signal requirement and the second signal requirement, for example, as further described above regarding FIGS. 2-5.

In yet another non-limiting aspect, an exemplary system as described herein can comprise means for receiving (e.g., exemplary IC 106, or portions thereof, etc.) from a host system (not shown) comprising the MEMS sensor package (e.g., a sensor package comprising a MEMS sensor element 102 of exemplary MEMS sensor systems or apparatuses 100, 200, 300, 400, 500, etc.) a signal (e.g., signal 108) associated with a determination of the at least the first signal requirement or the second signal requirement.

However, various exemplary implementations of exemplary MEMS sensor systems or apparatuses as described can additionally, or alternatively, include other features or functionality of MEMS sensors, associated ICs, sensors packages, and so on, as further detailed herein, for example, regarding FIGS. 1-5. In addition, while various non-limiting implementations have been described herein for the purposes of illustration, and not limitation, it can be understood that various alterations and/or modifications are available to those skilled in the art. As a non-limiting examples, while various embodiments are described herein in reference to a motion sensor comprising a MEMS sensor element (e.g., an accelerometer, a gyroscope, etc.) for the purposes of illustration, and not limitation, it can be understood that various embodiments as described herein can be employed in any kind of motion sensor system (e.g., a MEMS motion sensor element such as an accelerometer, a gyroscope, etc.) or any other sensor system (e.g., a MEMS microphone sensor system, etc) that supports host systems or applications having two or more different sensor output data requirements (e.g., OIS data requirements, UI data requirements, etc.) from a single sensor element. In addition, described embodiments can be employed on each signal of an X-axis, a Y-axis, and/or a Z-axis of a multi-axis MEMS motion sensor element (e.g., an accelerometer, a gyroscope, etc.), as described herein. In addition, while various embodiments are described herein in reference to a host system or application comprising a mobile device for the purposes of illustration, it can be understood that various embodiments as described herein can be employed in any kind of host system or application, without limitation. Moreover, while various embodiments are described herein in reference to specific numbers of components, outputs, etc. for the purposes of illustration, it can be understood that various embodiments as described herein can be employed in virtually any configuration with respect to generating multiple output signals (e.g., output signals 104a, 104b, ..., 104n, etc.) from a single MEMS sensor element 102, without limitation, for example, regarding the one or more signal multiplexers (e.g., MUX 212, MUX 214), the two or more output signals (e.g., output signals 104a, 104b, ..., 104n, etc.), and so on, without limitation.

In view of the subject matter described supra, methods that can be implemented in accordance with the subject disclosure will be better appreciated with reference to the flowcharts of FIGS. 6-9. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

Exemplary Methods

Figure 6:
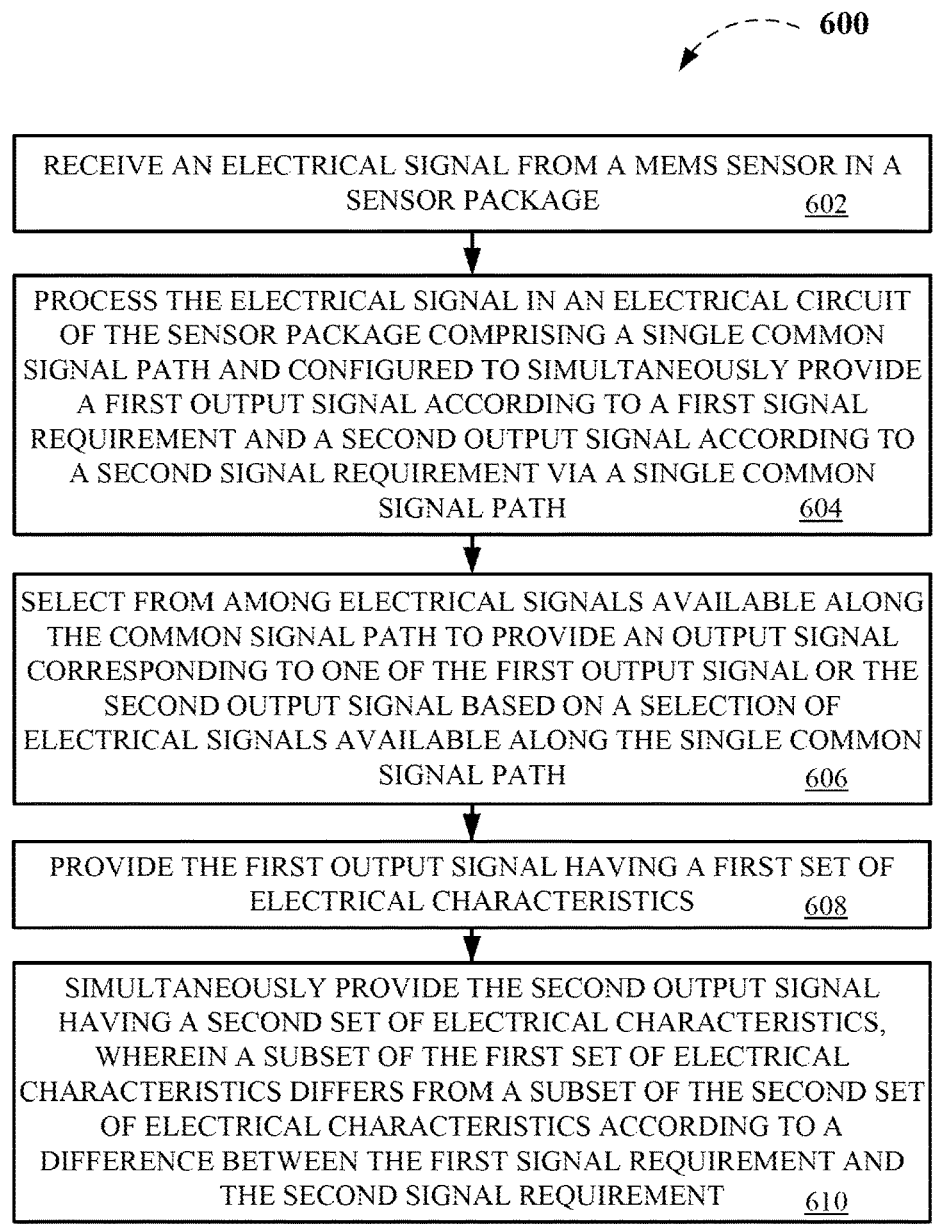
FIG. 6 depicts an exemplary flowchart of non-limiting methods associated with an exemplary MEMS sensor that facilitates generating multiple output signals with an associated IC, according to various non-limiting embodiments.

FIG. 6 depicts an exemplary flowchart of non-limiting methods 600 associated with an exemplary MEMS sensor (e.g., MEMS sensor element 102 of exemplary MEMS sensor systems or apparatuses 100, 200, 300, 400, 500, etc.) that facilitates generating multiple output signals (e.g., output signals 104a, 104b, ..., 104n, etc.) with an associated IC (e.g., exemplary IC 106), according to various non-limiting embodiments. As a non-limiting example, exemplary methods 600 can comprise receiving an electrical signal from a MEMS sensor (e.g., MEMS sensor element 102 of exemplary MEMS sensor systems or apparatuses 100, 200, 300, 400, 500, etc.) in a sensor package at 602. In a non-limiting aspect, exemplary methods 600 can comprise receiving the electrical signal from a MEMS motion sensor (e.g., MEMS sensor element 102 of exemplary MEMS sensor systems or apparatuses 100, 200, 300, 400, 500, etc.) comprising a MEMS accelerometer, a MEMS gyroscope, any other sensor system (e.g., a MEMS microphone sensor system, etc) that supports host systems or applications having two or more different sensor output data requirements from a single sensor element, and/or portions thereof such as each signal of an X-axis, a Y-axis, and/or a Z-axis of a multi-axis MEMS motion sensor element (e.g., an accelerometer, a gyroscope, etc.).

In a further non-limiting example, exemplary methods 600 can comprise processing the electrical signal in an electrical circuit of the sensor package comprising a single common signal path and configured to simultaneously provide one or more of a first output signal (e.g., one of output signal 104a or output signal 104b) according to a first signal requirement or a second output signal (e.g., the other of output signal 104a or output signal 104b) according to a second signal requirement via the single common signal path at 604. In a non-limiting aspect, an exemplary single common signal path can comprise amplifier 202 (e.g., analog amplifier 202), ADC 204, and multiple stages of digital filters (e.g., two or more of digital filter 206, digital filter 208, digital filter 210, etc.), for example, as described above regarding FIGS. 2-5. In another non-limiting aspect, an exemplary single common signal path can comprise amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.), as further described above. In a non-limiting aspect, exemplary methods 600 can further comprise processing the electrical signal via the single common signal path comprising an amplifier (e.g., analog amplifier 202) operatively coupled to the MEMS sensor (e.g., MEMS sensor element 102 of exemplary MEMS sensor systems or apparatuses 100, 200, 300, 400, 500, etc.) and configured to receive the electrical signal, an analog-to-digital converter (e.g., ADC 204) operatively coupled to the amplifier (e.g., analog amplifier 202), and two or more filters (e.g., two or more of digital filter 206, digital filter 208, digital filter 210, etc.) operatively coupled to the ADC (e.g., ADC 204).

Exemplary methods 600 can further comprise, at 606, selecting from among electrical signals available along the common signal path to provide an output signal (e.g., one of output signals 104a, 104b, ..., 104n, etc.) corresponding to one of the first output signal (e.g., one of output signal 104a or output signal 104b) or the second output signal (e.g., the other of output signal 104a or output signal 104b) based on a selection of electrical signals available along the single common signal path, as further described herein regarding FIGS. 2-5, for example. In a non-limiting aspect, exemplary methods 600 can further comprise determining one or more of a filtering characteristic (e.g., a signal corresponding to a collection of signals available from digital filter 206, digital filter 208, digital filter 210, etc.) or a data rate characteristic (data rate of an output signal) of the output signal (e.g., one of output signals 104a, 104b, ..., 104n, etc.) by selecting from among the electrical signals available along the common signal path with a multiplexer of the electrical circuit (e.g., one of multiplexers, MUX 212, MUX 214, etc.).

In addition, at 608, exemplary methods 600 can further comprise providing the first output signal (e.g., one of output signal 104a or output signal 104b) having a first set of electrical characteristics (e.g., a set of output data rate, latency, full-scale range (e.g., maximum signal that can be processed, etc.), a special filtering requirement, frequency response, and/or a signal standardization convention), while at 610, exemplary methods 600 can further comprise simultaneously providing the second output signal (e.g., the other of output signal 104a or output signal 104b) having a second set of electrical characteristics (e.g., a set of output data rate, latency, full-scale range (e.g., maximum signal that can be processed), a special filtering requirement, frequency response, and/or a signal standardization convention, etc.), wherein a subset of the first set of electrical characteristics differs from a subset of the second set of electrical characteristics according to a difference between the first signal requirement and the second signal requirement, for example, as further described above regarding FIGS. 2-5. In a non-limiting aspect of exemplary methods 600, simultaneously providing the second output signal (e.g., the other of output signal 104a or output signal 104b) can comprise providing the second output signal (e.g., the other of output signal 104a or output signal 104b) having a subset of the second set of electrical characteristics (e.g., a set of output data rate, latency, full-scale range (e.g., maximum signal that can be processed), a special filtering requirement, frequency response, and/or a signal standardization convention, etc.) that differs from one of the first set of electrical characteristics (e.g., a set of output data rate, latency, full-scale range (e.g., maximum signal that can be processed), a special filtering requirement, frequency response, and/or a signal standardization convention, etc.). In another non-limiting aspect, exemplary methods 600 can further comprise providing the second output signal (e.g., the other of output signal 104*a* or output signal 104*b*) having the signal standardization convention comprising one or more of I²C interface requirements or SPI requirements, that differs from the one of the first set of electrical characteristics.

However, various exemplary implementations of exemplary methods 600 as described can additionally, or alternatively, include other process steps associated with features or functionality of exemplary MEMS sensor (e.g., MEMS sensor element 102 of exemplary MEMS sensor systems or apparatuses 100, 200, 300, 400, 500, etc.) that facilitates generating multiple output signals (e.g., output signals 104*a*, 104*b*, . . . , 104*n*, etc.) with an associated IC (e.g., exemplary IC 106), as further detailed herein, for example, regarding FIGS. 1-5 and 7-10.

Figure 7:
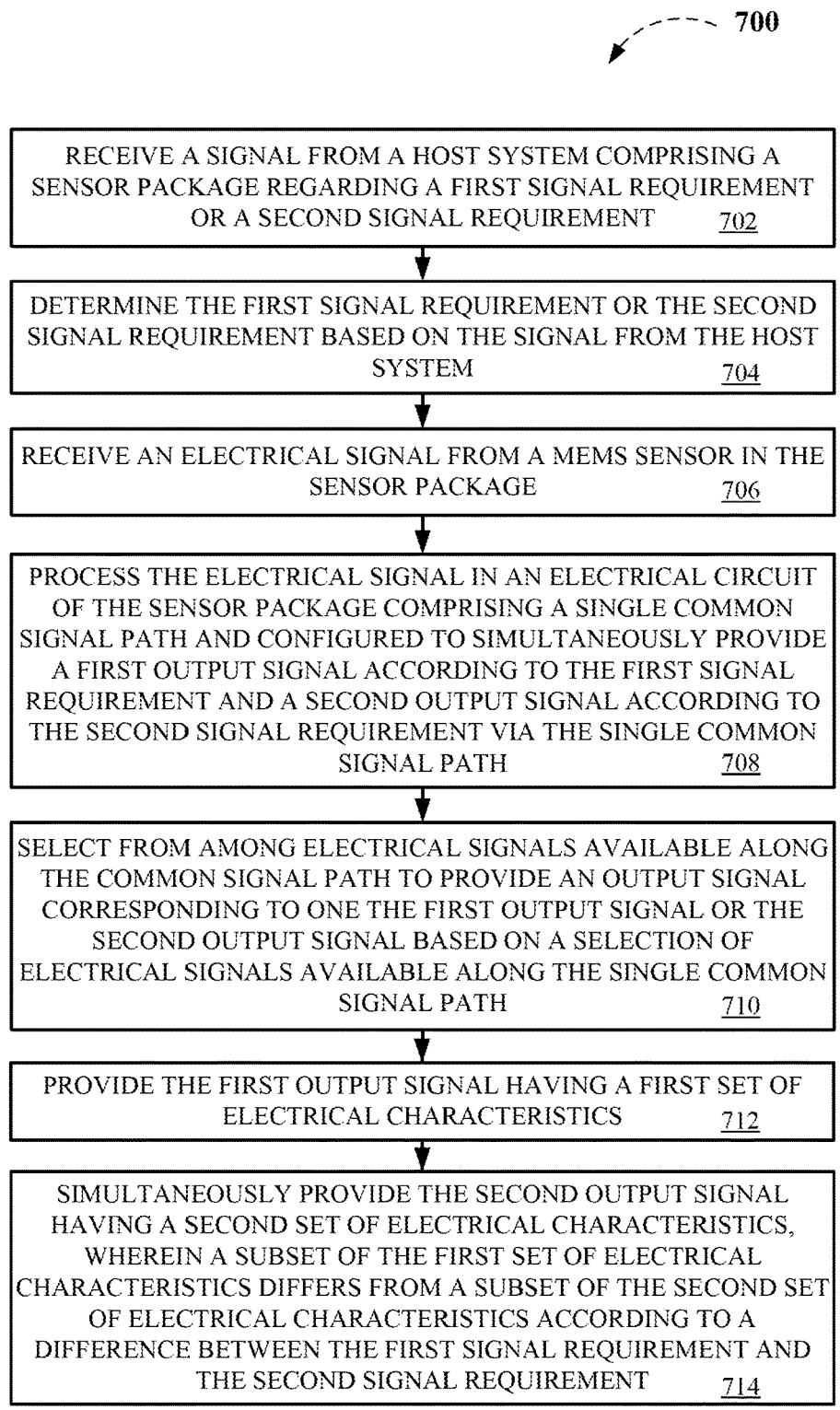
FIG. 7 depicts another exemplary flowchart of non-limiting methods associated with an exemplary MEMS sensor that facilitates generating multiple output signals with an associated IC, according to various non-limiting embodiments.

For example, FIG. 7 depicts another exemplary flowchart of non-limiting methods 700 associated with an exemplary MEMS sensor (e.g., MEMS sensor element 102 of exemplary MEMS sensor systems or apparatuses 100, 200, 300, 400, 500, etc.) that facilitates generating multiple output signals (e.g., output signals 104*a*, 104*b*, . . . , 104*n*, etc.) with an associated IC (e.g., exemplary IC 106), according to various non-limiting embodiments. In a non-limiting example, exemplary methods 700 can comprise receiving a signal (e.g., signal 108) from a host system comprising a sensor package (e.g., a sensor package comprising MEMS sensor element 102 of exemplary MEMS sensor systems or apparatuses 100, 200, 300, 400, 500, etc.) regarding a first signal requirement or a second signal requirement, at 702, for example, as further described herein, regarding FIG. 10. In a further non-limiting example, exemplary methods 700 can further comprise determining the first signal requirement or the second signal requirement based on the signal (e.g., signal 108) from the host system, at 704, for example, as further described herein, regarding FIG. 10.

As another non-limiting example, exemplary methods 700 can further comprise receiving an electrical signal from the MEMS sensor (e.g., MEMS sensor element 102 of exemplary MEMS sensor systems or apparatuses 100, 200, 300, 400, 500, etc.) in a sensor package at 706. In a non-limiting aspect, exemplary methods 700 can comprise receiving the electrical signal from a MEMS motion sensor (e.g., MEMS sensor element 102 of exemplary MEMS sensor systems or apparatuses 100, 200, 300, 400, 500, etc.) comprising a MEMS accelerometer, a MEMS gyroscope, any other sensor system (e.g., a MEMS microphone sensor system, etc) that supports host systems or applications having two or more different sensor output data requirements from a single sensor element, and/or portions thereof such as each signal of an X-axis, a Y-axis, and/or a Z-axis of a multi-axis MEMS motion sensor element (e.g., an accelerometer, a gyroscope, etc.).

In a further non-limiting example, exemplary methods 700 can comprise processing the electrical signal in an electrical circuit of the sensor package comprising a single common signal path and configured to simultaneously provide one or more of a first output signal (e.g., one of output signal 104*a* or output signal 104*b*) according to the first signal requirement or the second output signal (e.g., the other of output signal 104*a* or output signal 104*b*) according to a second signal requirement via the single common signal path at 708. In a non-limiting aspect, an exemplary single common signal path can comprise amplifier 202 (e.g., analog amplifier 202), ADC 204, and multiple stages of digital filters (e.g., two or more of digital filter 206, digital filter 208, digital filter 210, etc.), for example, as described above regarding FIGS. 2-5. In another non-limiting aspect, an exemplary single common signal path can comprise amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.), as further described above. In a non-limiting aspect, exemplary methods 700 can further comprise processing the electrical signal via the single common signal path comprising an amplifier (e.g., analog amplifier 202) operatively coupled to the MEMS sensor (e.g., MEMS sensor element 102 of exemplary MEMS sensor systems or apparatuses 100, 200, 300, 400, 500, etc.) and configured to receive the electrical signal, an analog-to-digital converter (e.g., ADC 204) operatively coupled to the amplifier (e.g., analog amplifier 202), and two or more filters (e.g., two or more of digital filter 206, digital filter 208, digital filter 210, etc.) operatively coupled to the ADC (e.g., ADC 204).

Exemplary methods 700 can further comprise, at 710, selecting from among electrical signals available along the common signal path to provide an output signal (e.g., one of output signals 104*a*, 104*b*, . . . , 104*n*, etc.) corresponding to one of the first output signal (e.g., one of output signal 104*a* or output signal 104*b*) or the second output signal (e.g., the other of output signal 104*a* or output signal 104*b*) based on a selection of electrical signals available along the single common signal path, as further described herein regarding FIGS. 2-5, for example. In a non-limiting aspect, exemplary methods 700 can further comprise determining one or more of a filtering characteristic (e.g., a signal corresponding to a collection of signals available from digital filter 206, digital filter 208, digital filter 210, etc.) or a data rate characteristic (data rate of an output signal) of the output signal (e.g., one of output signals 104*a*, 104*b*, . . . , 104*n*, etc.) by selecting from among the electrical signals available along the common signal path with a multiplexer of the electrical circuit (e.g., one of multiplexers, MUX 212, MUX 214, etc.).

In addition, at 712, exemplary methods 700 can further comprise providing the first output signal (e.g., one of output signal 104*a* or output signal 104*b*) having a first set of electrical characteristics (e.g., a set of output data rate, latency, full-scale range (e.g., maximum signal that can be processed, etc.), a special filtering requirement, frequency response, and/or a signal standardization convention), while at 714, exemplary methods 700 can further comprise simultaneously providing the second output signal (e.g., the other of output signal 104*a* or output signal 104*b*) having a second set of electrical characteristics (e.g., a set of output data rate, latency, full-scale range (e.g., maximum signal that can be processed), a special filtering requirement, frequency response, and/or a signal standardization convention, etc.), wherein a subset of the first set of electrical characteristics differs from a subset of the second set of electrical characteristics according to a difference between the first signal requirement and the second signal requirement, for example, as further described above regarding FIGS. 2-5. In a non-limiting aspect of exemplary methods 700, simultaneously providing the second output signal (e.g., the other of output signal 104*a* or output signal 104*b*) can comprise providing the second output signal (e.g., the other of output signal 104*a* or output signal 104*b*) having a subset of the second set of electrical characteristics (e.g., a set of output data rate, latency, full-scale range (e.g., maximum signal that can be processed), a special filtering requirement, frequency response, and/or a signal standardization convention, etc.) that differs from one of the first set of electrical characteristics (e.g., a set of output data rate, latency, full-scale range (e.g., maximum signal that can be processed), a special filtering requirement, frequency response, and/or a signal standardization convention, etc.). In another non-limiting aspect, exemplary methods 700 can further comprise providing the second output signal (e.g., the other of output signal 104a or output signal 104b) having the signal standardization convention comprising one or more of I²C interface requirements or SPI requirements, that differs from the one of the first set of electrical characteristics.

Figure 8:
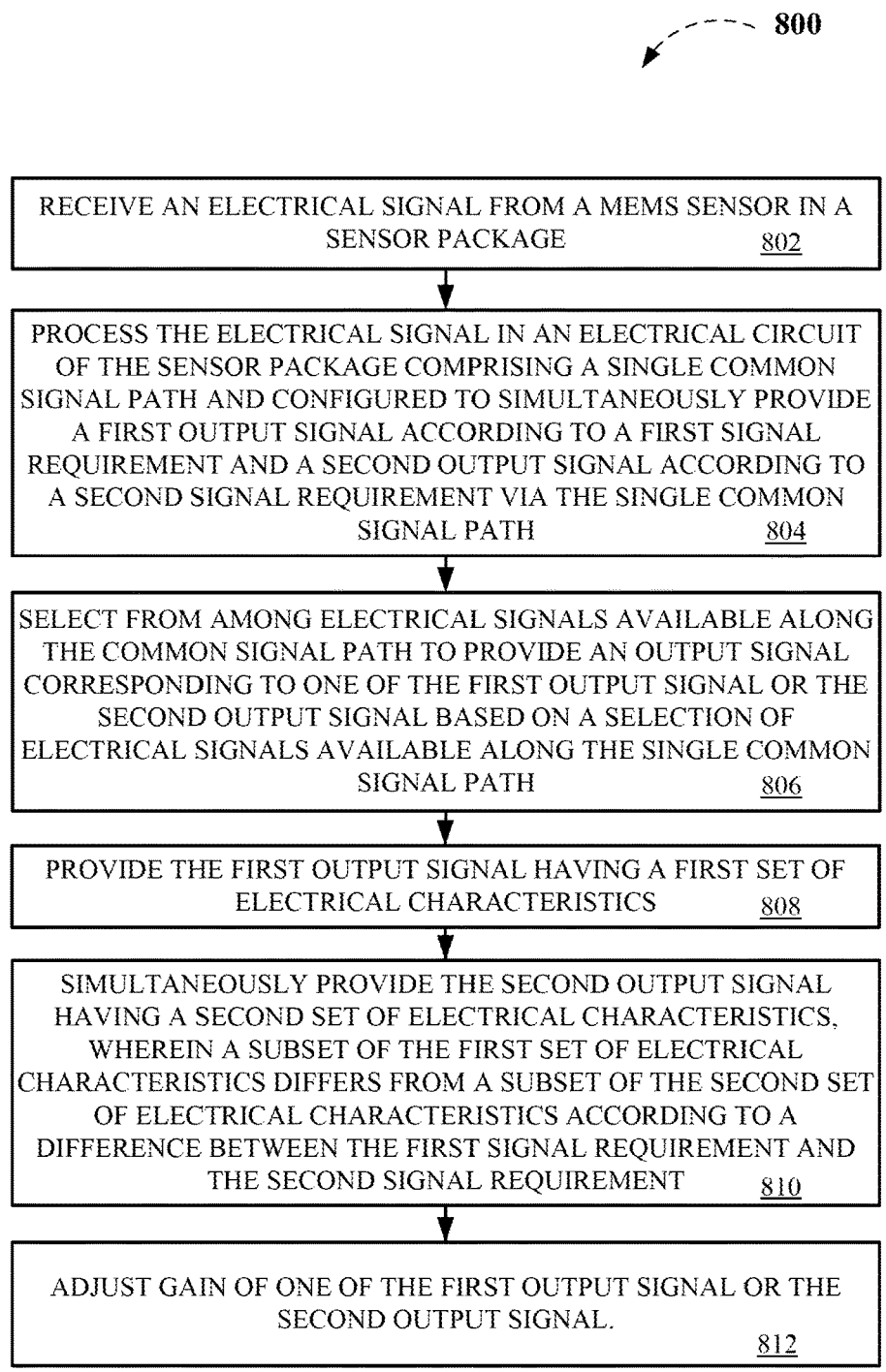
FIG. 8 depicts yet another exemplary flowchart of non-limiting methods associated with an exemplary MEMS sensor that facilitates generating multiple output signals with an associated IC, according to various non-limiting embodiments.

FIG. 8 depicts yet another exemplary flowchart of non-limiting methods 800 associated with an exemplary MEMS sensor (e.g., MEMS sensor element 102 of exemplary MEMS sensor systems or apparatuses 100, 200, 300, 400, 500, etc.) that facilitates generating multiple output signals (e.g., output signals 104a, 104b, . . . , 104n, etc.) with an associated IC (e.g., exemplary IC 106), according to various non-limiting embodiments. As a non-limiting example, exemplary methods 800 can comprise receiving an electrical signal from a MEMS sensor (e.g., MEMS sensor element 102 of exemplary MEMS sensor systems or apparatuses 100, 200, 300, 400, 500, etc.) in a sensor package at 802. In a non-limiting aspect, exemplary methods 800 can comprise receiving the electrical signal from a MEMS motion sensor (e.g., MEMS sensor element 102 of exemplary MEMS sensor systems or apparatuses 100, 200, 300, 400, 500, etc.) comprising a MEMS accelerometer, a MEMS gyroscope, any other sensor system (e.g., a MEMS microphone sensor system, etc) that supports host systems or applications having two or more different sensor output data requirements from a single sensor element, and/or portions thereof such as each signal of an X-axis, a Y-axis, and/or a Z-axis of a multi-axis MEMS motion sensor element (e.g., an accelerometer, a gyroscope, etc.).

In a further non-limiting example, exemplary methods 800 can comprise processing the electrical signal in an electrical circuit of the sensor package comprising a single common signal path and configured to simultaneously provide one or more of a first output signal (e.g., one of output signal 104a or output signal 104b) according to a first signal requirement or a second output signal (e.g., the other of output signal 104a or output signal 104b) according to a second signal requirement via the single common signal path at 804. In a non-limiting aspect, an exemplary single common signal path can comprise amplifier 202 (e.g., analog amplifier 202), ADC 204, and multiple stages of digital filters (e.g., two or more of digital filter 206, digital filter 208, digital filter 210, etc.), for example, as described above regarding FIGS. 2-5. In another non-limiting aspect, an exemplary single common signal path can comprise amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.), as further described above. In a non-limiting aspect, exemplary methods 800 can further comprise processing the electrical signal via the single common signal path comprising an amplifier (e.g., analog amplifier 202) operatively coupled to the MEMS sensor (e.g., MEMS sensor element 102 of exemplary MEMS sensor systems or apparatuses 100, 200, 300, 400, 500, etc.) and configured to receive the electrical signal, an analog-to-digital converter (e.g., ADC 204) operatively coupled to the amplifier (e.g., analog amplifier 202), and two or more filters (e.g., two or more of digital filter 206, digital filter 208, digital filter 210, etc.) operatively coupled to the ADC (e.g., ADC 204).

Exemplary methods 800 can further comprise, at 806, selecting from among electrical signals available along the common signal path to provide an output signal (e.g., one of output signals 104a, 104b, . . . , 104n, etc.) corresponding to one of the first output signal (e.g., one of output signal 104a or output signal 104b) or the second output signal (e.g., the other of output signal 104a or output signal 104b) based on a selection of electrical signals available along the single common signal path, as further described herein regarding FIGS. 2-5, for example. In a non-limiting aspect, exemplary methods 800 can further comprise determining one or more of a filtering characteristic (e.g., a signal corresponding to a collection of signals available from digital filter 206, digital filter 208, digital filter 210, etc.) or a data rate characteristic (data rate of an output signal) of the output signal (e.g., one of output signals 104a, 104b, . . . , 104n, etc.) by selecting from among the electrical signals available along the common signal path with a multiplexer of the electrical circuit (e.g., one of multiplexers, MUX 212, MUX 214, etc.).

In addition, at 808, exemplary methods 800 can further comprise providing the first output signal (e.g., one of output signal 104a or output signal 104b) having a first set of electrical characteristics (e.g., a set of output data rate, latency, full-scale range (e.g., maximum signal that can be processed, etc.), a special filtering requirement, frequency response, and/or a signal standardization convention), while at 810, exemplary methods 800 can further comprise simultaneously providing the second output signal (e.g., the other of output signal 104a or output signal 104b) having a second set of electrical characteristics (e.g., a set of output data rate, latency, full-scale range (e.g., maximum signal that can be processed), a special filtering requirement, frequency response, and/or a signal standardization convention, etc.), wherein a subset of the first set of electrical characteristics differs from a subset of the second set of electrical characteristics according to a difference between the first signal requirement and the second signal requirement, for example, as further described above regarding FIGS. 2-5. In a non-limiting aspect of exemplary methods 800, simultaneously providing the second output signal (e.g., the other of output signal 104a or output signal 104b) can comprise providing the second output signal (e.g., the other of output signal 104a or output signal 104b) having a subset of the second set of electrical characteristics (e.g., a set of output data rate, latency, full-scale range (e.g., maximum signal that can be processed), a special filtering requirement, frequency response, and/or a signal standardization convention, etc.) that differs from one of the first set of electrical characteristics (e.g., a set of output data rate, latency, full-scale range (e.g., maximum signal that can be processed), a special filtering requirement, frequency response, and/or a signal standardization convention, etc.). In another non-limiting aspect, exemplary methods 800 can further comprise providing the second output signal (e.g., the other of output signal 104a or output signal 104b) having the signal standardization convention comprising one or more of I²C interface requirements or SPI requirements, that differs from the one of the first set of electrical characteristics.

In another non-limiting example, exemplary methods 800 can comprise, at 812, adjusting gain (e.g., via an exemplary gain adjustment component, such as, one of digital variable gain amplifier 218, digital variable gain amplifier 220, etc. of exemplary IC 106) of one of the first output signal (e.g., one of output signal 104a or output signal 104b) or the second output signal (e.g., the other of output signal 104a or output signal 104b).

Figure 9:
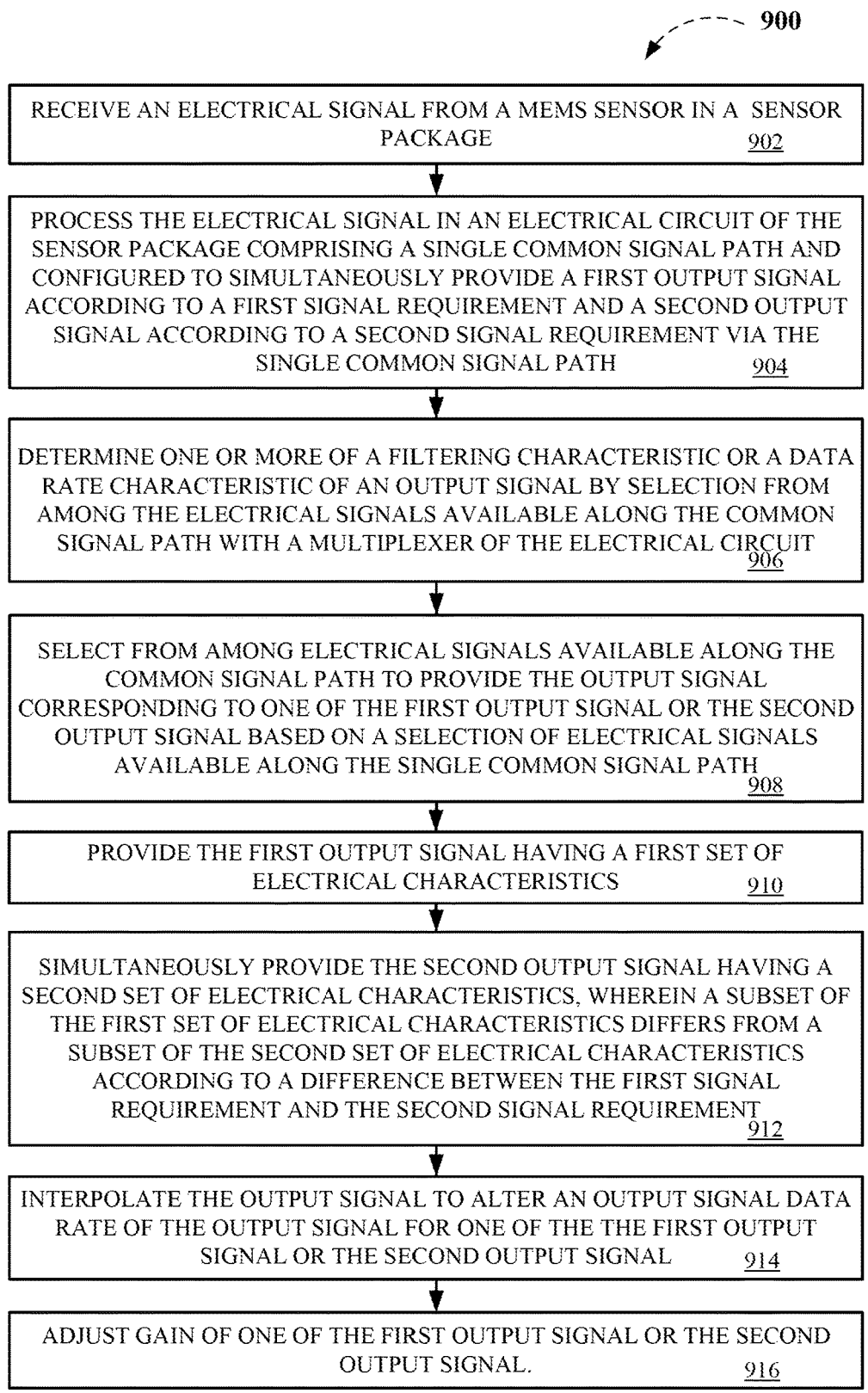
FIG. 9 depicts still another exemplary flowchart of non-limiting methods associated with an exemplary MEMS sensor that facilitates generating multiple output signals with an associated IC, according to various non-limiting embodiments.

FIG. 9 depicts still another exemplary flowchart of non-limiting methods associated with an exemplary MEMS sensor (e.g., MEMS sensor element 102 of exemplary MEMS sensor systems or apparatuses 100, 200, 300, 400, 500, etc.) that facilitates generating multiple output signals (e.g., output signals 104a, 104b, . . . , 104n, etc.) with an associated IC (e.g., exemplary IC 106), according to various non-limiting embodiments. As a non-limiting example, exemplary methods 900 can comprise receiving an electrical signal from a MEMS sensor (e.g., MEMS sensor element 102 of exemplary MEMS sensor systems or apparatuses 100, 200, 300, 400, 500, etc.) in a sensor package at 902. In a non-limiting aspect, exemplary methods 900 can comprise receiving the electrical signal from a MEMS motion sensor (e.g., MEMS sensor element 102 of exemplary MEMS sensor systems or apparatuses 100, 200, 300, 400, 500, etc.) comprising a MEMS accelerometer, a MEMS gyroscope, any other sensor system (e.g., a MEMS microphone sensor system, etc) that supports host systems or applications having two or more different sensor output data requirements from a single sensor element, and/or portions thereof such as each signal of an X-axis, a Y-axis, and/or a Z-axis of a multi-axis MEMS motion sensor element (e.g., an accelerometer, a gyroscope, etc.).

In a further non-limiting example, exemplary methods 900 can comprise processing the electrical signal in an electrical circuit of the sensor package comprising a single common signal path and configured to simultaneously provide one or more of a first output signal (e.g., one of output signal 104a or output signal 104b) according to a first signal requirement or a second output signal (e.g., the other of output signal 104a or output signal 104b) according to a second signal requirement via the single common signal path at 904. In a non-limiting aspect, an exemplary single common signal path can comprise amplifier 202 (e.g., analog amplifier 202), ADC 204, and multiple stages of digital filters (e.g., two or more of digital filter 206, digital filter 208, digital filter 210, etc.), for example, as described above regarding FIGS. 2-5. In another non-limiting aspect, an exemplary single common signal path can comprise amplifier 202 (e.g., analog amplifier 202), ADC 204, a signal correction component 216 (e.g., circuitry for correction of gain, offset, etc.), and multiple stages of digital filters (e.g., two or more of digital filter 206, digital filter 208, digital filter 210, etc.), as further described above. In a non-limiting aspect, exemplary methods 900 can further comprise processing the electrical signal via the single common signal path comprising an amplifier (e.g., analog amplifier 202) operatively coupled to the MEMS sensor (e.g., MEMS sensor element 102 of exemplary MEMS sensor systems or apparatuses 100, 200, 300, 400, 500, etc.) and configured to receive the electrical signal, an analog-to-digital converter (e.g., ADC 204) operatively coupled to the amplifier (e.g., analog amplifier 202), and two or more filters (e.g., two or more of digital filter 206, digital filter 208, digital filter 210, etc.) operatively coupled to the ADC (e.g., ADC 204).

In a non-limiting aspect, exemplary methods 800 can further comprise, at 906, determining one or more of a filtering characteristic (e.g., a signal corresponding to a collection of signals available from digital filter 206, digital filter 208, digital filter 210, etc.) or a data rate characteristic (data rate of an output signal) of the output signal (e.g., one of output signals 104a, 104b, . . . , 104n, etc.) by selecting from among the electrical signals available along the common signal path with a multiplexer of the electrical circuit (e.g., one of multiplexers, MUX 212, MUX 214, etc.). Exemplary methods 900 can further comprise, at 908, selecting from among electrical signals available along the common signal path to provide an output signal (e.g., one of output signals 104a, 104b, . . . , 104n, etc.) corresponding to one of the first output signal (e.g., one of output signal 104a or output signal 104b) or the second output signal (e.g., the other of output signal 104a or output signal 104b) based on a selection of electrical signals available along the single common signal path, as further described herein regarding FIGS. 2-5, for example.

In addition, at 910, exemplary methods 900 can further comprise providing the first output signal (e.g., one of output signal 104a or output signal 104b) having a first set of electrical characteristics (e.g., a set of output data rate, latency, full-scale range (e.g., maximum signal that can be processed, etc.), a special filtering requirement, frequency response, and/or a signal standardization convention), while at 912, exemplary methods 900 can further comprise simultaneously providing the second output signal (e.g., the other of output signal 104a or output signal 104b) having a second set of electrical characteristics (e.g., a set of output data rate, latency, full-scale range (e.g., maximum signal that can be processed), a special filtering requirement, frequency response, and/or a signal standardization convention, etc.), wherein a subset of the first set of electrical characteristics differs from a subset of the second set of electrical characteristics according to a difference between the first signal requirement and the second signal requirement, for example, as further described above regarding FIGS. 2-5. In a non-limiting aspect of exemplary methods 900, simultaneously providing the second output signal (e.g., the other of output signal 104a or output signal 104b) can comprise providing the second output signal (e.g., the other of output signal 104a or output signal 104b) having a subset of the second set of electrical characteristics (e.g., a set of output data rate, latency, full-scale range (e.g., maximum signal that can be processed), a special filtering requirement, frequency response, and/or a signal standardization convention, etc.) that differs from one of the first set of electrical characteristics (e.g., a set of output data rate, latency, full-scale range (e.g., maximum signal that can be processed), a special filtering requirement, frequency response, and/or a signal standardization convention, etc.). In another non-limiting aspect, exemplary methods 900 can further comprise providing the second output signal (e.g., the other of output signal 104a or output signal 104b) having the signal standardization convention comprising one or more of $I^2C$ interface requirements or SPI requirements, that differs from the one of the first set of electrical characteristics.

In addition, at 914, exemplary methods 900 can further comprise interpolating (e.g., via an interpolator, such as, interpolator 402, etc. operatively coupled to a respective one of the one or more multiplexers, MUX 212 or MUX 214) the output signal (e.g., one of output signals 104a, 104b, . . . , 104n, etc.) to alter an output signal data rate of the output signal (e.g., one of output signals 104a, 104b, . . . , 104n, etc.) for one of the first output signal (e.g., one of output signal 104a or output signal 104b) or the second output signal (e.g., the other of output signal 104a or output signal 104b), for example, as further described herein, regarding FIGS. 4-5.

In another non-limiting example, exemplary methods 900 can comprise, at 916, adjusting gain (e.g., via an exemplary gain adjustment component, such as, one of digital variable gain amplifier 218, digital variable gain amplifier 220, etc.

of exemplary IC 106) of one of the first output signal (e.g., one of output signal 104*a* or output signal 104*b*) or the second output signal (e.g., the other of output signal 104*a* or output signal 104*b*).

Exemplary Host System or Device

FIG. 10 depicts a schematic diagram of an exemplary host system or device comprising mobile device 1000 (e.g., a mobile handset) that can facilitate various non-limiting aspects of the subject disclosure in accordance with the embodiments described herein. Accordingly, exemplary mobile device can comprise or be associated with MEMS sensor element 102, and/or portions or combinations thereof, as well as other disclosed components, devices, features, functionality, logic configured according to provided designs, portions thereof, and so on, without limitation. Although mobile handset 1000 is illustrated herein, it will be understood that other devices, whether mobile devices or otherwise, can facilitate various non-limiting aspects of the subject disclosure. In accordance with the embodiments described herein, exemplary devices suitable for performing various aspects described herein can include, without limitation, a sensor package and/or associated signal processing components such as ASICs (e.g., exemplary IC 106) and the like, a desktop computer, a cellular phone, a laptop computer, a tablet personal computer (PC) device, and/or a personal digital assistant (PDA), or other mobile device, and so on comprising various embodiments of exemplary MEMS sensor systems or apparatuses 100, 200, 300, 400, 500, etc. As further examples, exemplary devices suitable for performing various aspects described herein can include, without limitation, cameras, global positioning system (GPS) devices, and other such devices as a pen computing device, portable digital music player, home entertainment devices, network capable devices, appliances, kiosks, and sensors, and so on. It is to be understood that exemplary mobile device 1000 can comprise more or less functionality than those exemplary devices described above, as the context requires, and as further described herein.

As described above, exemplary MEMS sensor systems or apparatuses 100, 200, 300, 400, 500, etc., as described herein, can facilitate simultaneously providing two or more output data streams (e.g., output signals 104*a*, 104*b*, . . . , 104*n*, etc.) to two or more host systems or applications (e.g., processes operating on a host system such as mobile device 1000, etc.) from a single MEMS sensor element 102 having a single common signal path. As a non-limiting example, mobile device 1000 can have two or more motion sensor output data requirements (e.g., one for OIS and one or more for a UI of the host system comprising mobile device 1000. Accordingly, exemplary MEMS sensor systems or apparatuses 100, 200, 300, 400, 500, etc., as described herein, can facilitate simultaneously providing two or more output data streams (e.g., output signals 104*a*, 104*b*, . . . , 104*n*, etc.) to two or more host systems or applications (e.g., an OIS process, one or more UI processes, etc.) from a single MEMS sensor element 102, simultaneously (e.g., one to track user input for the UI, another to determine orientation of the mobile device, and/or another to provide a data output for OIS when taking a picture, etc.), where each data output can have different output data requirements. Thus, exemplary MEMS sensor systems or apparatuses 100, 200, 300, 400, 500, etc., can facilitate providing two or more data outputs (e.g., output signals 104*a*, 104*b*, . . . , 104*n*, etc.) to mobile device 1000 where each data output can have different output data requirements.

Accordingly, as further described above regarding FIGS. 1-5, non-limiting implementations of exemplary MEMS sensor system or apparatus 100, 200, 300, 400, 500, etc., comprising a MEMS sensor package including exemplary MEMS sensor element 102, exemplary IC 106 can be further configured to determine one or more of the first signal requirement or the second signal requirement based on a signal 108 received from a host system or device (e.g., mobile device 1000, etc.) comprising the MEMS sensor package. Thus, in a non-limiting example, exemplary host system or device (e.g., mobile device 1000, etc.) can be configured to transmit a signal 108 that can facilitate exemplary IC 106 determination of one or more of the first signal requirement or the second signal requirement. As a further non-limiting example, various embodiments of exemplary MEMS sensor system or apparatus 100 can comprise exemplary IC 106 that can be further configured to receive the signal 108 from the host system (e.g., mobile device 1000, etc.) and to simultaneously provide the first output signal and the second output signal based in part on the signal 108 from the host system or device (e.g., mobile device 1000, etc.). In other non-limiting implementations of host system or device (e.g., mobile device 1000), exemplary host system or device (e.g., mobile device 1000, etc.) can be configured to transmit other signals, data, or instructions that can facilitate exemplary IC 106 turning off a number of blocks of various embodiments of exemplary MEMS sensor systems or apparatuses 200, 300, 400, 500, etc. to save power (e.g., blocks associated with a data output associated with OIS, etc.).

While exemplary host system or device comprising mobile device 1000 is merely illustrated to provide context for the embodiments of the subject matter described herein, the following discussion is intended to provide a brief, general description of an example of a suitable environment 1000 in which the various embodiments can be implemented. While the description includes a general context of computer-executable instructions embodied on a non-transitory computer readable storage medium, those skilled in the art will recognize that the subject matter also can be implemented in combination with other program modules or components and/or as a combination of hardware and software.

Generally, applications (e.g., program modules) can include routines, programs, components, data structures, etc., that perform particular tasks or implement particular abstract data types. Moreover, those skilled in the art will appreciate that the methods described herein can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated devices.

A computing device can typically include a variety of computer-readable media. Computer readable media can comprise any available media that can be accessed by the computer and includes both volatile and non-volatile media, removable and non-removable media. By way of example and not limitation, computer-readable media can comprise computer storage media and communication media. Computer storage media can include volatile and/or non-volatile media, removable and/or non-removable media implemented in any method or technology for storage of information, such as computer-readable instructions, data structures, program modules, or other data. Computer storage media can include, but is not limited to, RAM, ROM, EEPROM, flash memory or other memory technology, CD ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules, or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable communications media as distinguishable from computer-readable storage media.

The handset 1000 can include a processor 1002 for controlling and processing all onboard operations and functions. A memory 1004 interfaces to the processor 1002 for storage of data and one or more applications 1006 (e.g., communications applications such as IM, SMS, adaptable to electronic payments as described herein and/or other application specifically targeted to electronic payments for transfers, such as MTMS, etc.). The applications 1006 can be stored in the memory 1004 and/or in a firmware 1008, and executed by the processor 1002 from either or both the memory 1004 or/and the firmware 1008. The firmware 1008 can also store startup code for execution in initializing the handset 1000. A communications component 1010 interfaces to the processor 1002 to facilitate wired/wireless communication with external systems, e.g., cellular networks, VoIP networks, and so on. Here, the communications component 1010 can also include a suitable cellular transceiver 1011 (e.g., a GSM transceiver) and/or an unlicensed transceiver 1013 (e.g., Wireless Fidelity (WiFi™), Worldwide Interoperability for Microwave Access (WiMax®)) for corresponding signal communications. The communications component 1010 also facilitates communications reception from terrestrial radio networks (e.g., broadcast), digital satellite radio networks, and Internet-based radio services networks.

The handset 1000 includes a display 1012 for displaying text, images, video, telephony functions (e.g., a Caller ID function), setup functions, and for user input. For example, the display 1012 can also be referred to as a "screen" that can accommodate the presentation of multimedia content (e.g., music metadata, messages, wallpaper, graphics, etc.). The display 1012 can also display videos and can facilitate the generation, editing and sharing of video quotes. A serial I/O interface 1014 is provided in communication with the processor 1002 to facilitate wired and/or wireless serial communications (e.g., Universal Serial Bus (USB), and/or Institute of Electrical and Electronics Engineers (IEEE) 2394) through a hardwire connection, and other serial input devices (e.g., a keyboard, keypad, and mouse). This supports updating and troubleshooting the handset 1000, for example. Audio capabilities are provided with an audio I/O component 1016, which can include a speaker for the output of audio signals related to, for example, indication that the user pressed the proper key or key combination to initiate the user feedback signal. The audio I/O component 1016 also facilitates the input of audio signals through a microphone to record data and/or telephony voice data, and for inputting voice signals for telephone conversations.

The handset 1000 can include a slot interface 1018 for accommodating a SIC (Subscriber Identity Component) in the form factor of a card Subscriber Identity Module (SIM) or universal SIM 1020, and interfacing the SIM card 1020 with the processor 1002. However, it is to be appreciated that the SIM card 1020 can be manufactured into the handset 1000, and updated by downloading data and software.

The handset 1000 can process Internet Protocol (IP) data traffic through the communication component 1010 to accommodate IP traffic from an IP network such as, for example, the Internet, a corporate intranet, a home network, a person area network, etc., through an ISP or broadband cable provider. Thus, VoIP traffic can be utilized by the handset 1000 and IP-based multimedia content can be received in either an encoded or a decoded format.

A video processing component 1022 (e.g., a camera) can be provided for decoding encoded multimedia content. The video processing component 1022 can aid in facilitating the generation and/or sharing of video. The handset 1000 also includes a power source 1024 in the form of batteries and/or an alternating current (AC) power subsystem, which power source 1024 can interface to an external power system or charging equipment (not shown) by a power input/output (I/O) component 1026.

The handset 1000 can also include a video component 1030 for processing video content received and, for recording and transmitting video content. For example, the video component 1030 can facilitate the generation, editing and sharing of video. A location-tracking component 1032 facilitates geographically locating the handset 1000. A user input component 1034 facilitates the user inputting data and/or making selections as previously described. The user input component 1034 can also facilitate selecting perspective recipients for fund transfer, entering amounts requested to be transferred, indicating account restrictions and/or limitations, as well as composing messages and other user input tasks as required by the context. The user input component 1034 can include such conventional input device technologies such as a keypad, keyboard, mouse, stylus pen, and/or touch screen, for example.

Referring again to the applications 1006, a hysteresis component 1036 facilitates the analysis and processing of hysteresis data, which is utilized to determine when to associate with an access point. A software trigger component 1038 can be provided that facilitates triggering of the hysteresis component 1038 when a WiFi™ transceiver 1013 detects the beacon of the access point. A SIP client 1040 enables the handset 1000 to support SIP protocols and register the subscriber with the SIP registrar server. The applications 1006 can also include a communications application or client 1046 that, among other possibilities, can be target for transfer money plugin or user interface component functionality as described above.

The handset 1000, as indicated above related to the communications component 1010, includes an indoor network radio transceiver 1013 (e.g., WiFi transceiver). This function supports the indoor radio link, such as IEEE 1002.11, for the dual-mode Global System for Mobile Communications (GSM) handset 1000. The handset 1000 can accommodate at least satellite radio services through a handset that can combine wireless voice and digital radio chipsets into a single handheld device.

It can be understood that while a brief overview of exemplary systems, methods, scenarios, and/or devices has been provided, the disclosed subject matter is not so limited. Thus, it can be further understood that various modifications, alterations, addition, and/or deletions can be made without departing from the scope of the embodiments as described herein. Accordingly, similar non-limiting implementations can be used or modifications and additions can be made to the described embodiments for performing the same or equivalent function of the corresponding embodiments without deviating therefrom.

As used in this application, the terms "component," "module," "device" and "system" can refer to a computer-related entity, either hardware, a combination of hardware and software, software, or software in execution. As one example, a component or module can be, but is not limited to being, a process running on a processor, a processor or portion thereof, a hard disk drive, multiple storage drives (of optical and/or magnetic storage medium), an object, an executable, a thread of execution, a program, and/or a computer. By way of illustration, both an application running on a server and the server can be a component or module. One or more components or modules scan reside within a process and/or thread of execution, and a component or module can be localized on one computer or processor and/or distributed between two or more computers or processors.

As used herein, the term to "infer" or "inference" can refer generally to the process of reasoning about or inferring states of the system, and/or environment from a set of observations as captured via events, signals, and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word, "exemplary," is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. An apparatus, comprising:
A microelectromechanical systems (MEMS) sensor package comprising a MEMS sensor;
an integrated circuit (IC) disposed in the MEMS sensor package, configured to receive an electrical signal from the MEMS sensor, and comprising an electrical circuit comprising a single common signal path from the MEMS sensor and configured to simultaneously provide at least a first output signal according to a first signal requirement and a second output signal according to a second signal requirement, wherein the first signal requirement and the second signal requirement differs in at least one of a set of respective electrical characteristics;
at least two signal outputs of the sensor package corresponding to the at least the first output signal and the second output signal; and
at least one signal multiplexer of the IC configured to provide an output signal corresponding to one of the at least the first output signal and the second output signal based on a selection from among electrical signals available along the single common signal path.

2. The apparatus of claim 1, wherein the single common signal path comprises electrical circuitry comprising at least an amplifier operatively coupled to the MEMS sensor, an analog-to-digital converter (ADC) operatively coupled to the amplifier, and a plurality of filters operatively coupled to the ADC and configured to provide the electrical signals available along the single common signal path.

3. The apparatus of claim 2, wherein the electrical signals available along the single common signal path comprise at least a plurality of a first signal at an output of the ADC, a second signal at an output of a first digital filter of the plurality of filters, or a third signal at an output of a second digital filter of the plurality of filters.

4. The apparatus of claim 1, wherein the at least one signal multiplexer of the IC is further configured to determine at least one of a filtering characteristic or, a data rate characteristic of the output signal corresponding to the one of the at least the first output signal and the second output signal based on the selection from among electrical signals available along the single common signal path.

5. The apparatus of claim 1, wherein the MEMS sensor comprises a MEMS motion sensor comprising at least one of a MEMS gyroscope or a MEMS accelerometer.

6. The apparatus of claim 1, further comprising:
a second signal multiplexer of the IC configured to provide another output signal corresponding to the other of the at least the first output signal and the second output signal.

7. The apparatus of claim 1, further comprising:
a first gain adjustment component of the IC configured to provide the first output signal according to the first signal requirement; and
a second gain adjustment component of the IC configured to provide the second output signal according to a second signal requirement.

8. The apparatus of claim 1, further comprising:
an interpolator of, the IC operatively coupled to the at least one multiplexer and configured to condition the output signal corresponding to one of the at least the first output signal and the second output signal.

9. The apparatus of claim 1, wherein the set of respective electrical characteristics comprises at least one of a full-scale range, an output data rate, a latency, a frequency response, or a signal standardization convention associated with the first output signal and the second output signal.

10. The apparatus of claim 9, wherein the signal standardization convention comprises signal requirements associated with at least one of Inter-Integrated Circuit (I²C) interface requirements or Serial Peripheral Interface (SPI) requirements.

11. The apparatus of claim 1, wherein the IC is further configured to determine at least one of the first signal requirement or the second signal requirement based OR a signal received from a host system comprising the MEMS sensor package.

12. The apparatus of claim 11, wherein the IC is further configured to receive the signal from the host system and to simultaneously provide the at least the first output signal or the second output signal based at least in part on the signal from the host system.

13. A method, comprising:
receiving an electrical signal from a microelectromechanical systems (MEMS) sensor in a sensor package;
processing the electrical signal in an electrical circuit of the sensor package comprising a single common signal path and configured to simultaneously provide at least a first output signal according to a first signal requirement and a second output signal according to a second signal requirement via the single common signal path;
selecting from among electrical signals available along the common signal path to provide an output signal corresponding to one of the at least the first output signal and the second output signal based on a selection of electrical signals available along the single common signal path;
providing the first output signal, having a first set of electrical characteristics; and
simultaneously providing the second output signal having a second set of electrical characteristics, wherein at least a subset of the first set of electrical characteristics differs from at least a subset of the second set of electrical characteristics according to a difference between the first signal requirement and the second signal requirement.

14. The method of claim 13, wherein receiving the electrical signal from the MEMS sensor comprises receiving the electrical signal from a MEMS motion sensor comprising at least one of a MEMS accelerometer or a MEMS gyroscope.

15. The method of claim 13, wherein the processing the electrical signal in the electrical circuit via the single common signal path comprises processing the electrical signal via the single common signal path comprising an amplifier operatively coupled to the MEMS sensor and configured to receive the electrical signal, an analog-to-digital converter (ADC) operatively coupled to the amplifier, and a plurality of filters operatively coupled to the ADC.

16. The method of claim 13, wherein the simultaneously providing the second output signal comprises providing the second output signal having at least one of the subset of the second set of electrical characteristics comprising full-scale range, an output data rate, a latency, a frequency response, or a signal standardization convention that differs from at least one of the subset of the first set of electrical characteristics.

17. The method of claim 13, wherein the providing the second output signal comprises providing the second output signal having the signal standardization convention, comprising at least one of Inter-Integrated Circuit (I²C) interface requirements or Serial Peripheral Interface (SPI) requirements, that differs from the at least one of the subset of the first set of electrical characteristics.

18. The method of claim 13, wherein the selecting the electrical signals available along the common signal path comprises determining at least one of a filtering characteristic or a data rate characteristic of the output signal by selecting from among the electrical signals available along the common signal path with a multiplexer of the electrical circuit.

19. The method of claim 18, further comprising:
interpolating the output signal to alter an output signal data rate of the output signal for the one of the at least the first output signal and the second output signal.

20. The method of claim 19, further comprising:
adjusting gain of the one of the at least the first output signal and the second output signal.

21. The method of claim 13, further comprising:
receiving a signal from a host system comprising the sensor package regarding at least one of the first signal requirement or the second signal requirement; and
determining the at least one of the first signal requirement or the second signal requirement based on the signal from the host system.

22. A system comprising:
a microelectromechanical systems (MEMS) sensor package comprising a MEMS sensor, wherein the MEMS sensor is configured to provide an electrical signal;
means for processing the electrical signal and for simultaneously providing at least a first output signal according to a first signal requirement and a second output signal according to a second signal requirement;
means for determining at least the first signal requirement or the second signal requirement;
means for selecting from among electrical signals available in a signal common signal path associated with the MEMS sensor to provide an output signal corresponding to one of the at least the first output signal and the second output signal based on a selection from among the electrical signals;
means for providing the first output signal having a first set of electrical characteristics; and
means for simultaneously providing the second output signal having a second set of electrical characteristics, wherein at least a subset of the first set of electrical characteristics differs from at least a subset of the second set of electrical, characteristics according to a difference between the first signal requirement and the second signal requirement.

23. The system of claim 22, wherein the MEMS sensor comprises a MEMS motion sensor comprising at least one of a MEMS gyroscope or a MEMS accelerometer.

24. The system of claim 22, wherein the first set of electrical characteristics and the second set of electrical characteristics are associated with at least one of a set of respective electrical characteristics comprising full-scale range, an output data rate, a latency, a frequency response, filtering characteristics, or a signal standardization convention associated with the first output signal and the second output signal.

25. The system of claim 21, wherein the signal standardization convention comprises signal requirements associated with at least one of Inter-Integrated Circuit (I²C) interface requirements or Serial Peripheral Interface (SPI) requirements.

26. The system of claim 21, further comprising:
means for receiving from a host system comprising the MEMS sensor package a signal associated with a determination of the at least the first signal requirement or the second signal requirement.

* * * * *